US009324696B2

(12) United States Patent
Choi et al.

(10) Patent No.: US 9,324,696 B2
(45) Date of Patent: Apr. 26, 2016

(54) PACKAGE-ON-PACKAGE DEVICES, METHODS OF FABRICATING THE SAME, AND SEMICONDUCTOR PACKAGES

(71) Applicants: Mi-Na Choi, Yongin-si (KR); Seran Bae, Yongin-si (KR); Yunhyeok Im, Hwaseong-si (KR)

(72) Inventors: Mi-Na Choi, Yongin-si (KR); Seran Bae, Yongin-si (KR); Yunhyeok Im, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/468,361

(22) Filed: Aug. 26, 2014

(65) Prior Publication Data

US 2015/0061095 A1    Mar. 5, 2015

(30) Foreign Application Priority Data

Aug. 29, 2013    (KR) .................. 10-2013-0103460

(51) Int. Cl.
*H01L 25/10* (2006.01)
*H01L 23/36* (2006.01)
(Continued)

(52) U.S. Cl.
CPC .......... *H01L 25/105* (2013.01); *H01L 21/4853* (2013.01); *H01L 23/36* (2013.01); *H01L 23/49811* (2013.01); *H01L 23/49816* (2013.01); *H01L 23/49827* (2013.01); *H01L 23/5385* (2013.01); *H01L 23/5389* (2013.01); *H01L 23/552* (2013.01); *H01L 24/20* (2013.01); *H01L 24/29* (2013.01); *H01L 25/50* (2013.01); *H01L 23/3128* (2013.01); *H01L 24/13* (2013.01);
(Continued)

(58) Field of Classification Search
CPC .................. H01L 23/49816; H01L 23/49811; H01L 23/5385; H01L 23/5389; H01L 25/105; H01L 23/49827; H01L 23/3128; H01L 21/4853; H01L 23/36
See application file for complete search history.

(56) References Cited

U.S. PATENT DOCUMENTS 6,239,496 B1 * 5/2001 Asada ................... H01L 21/563
257/685
7,245,022 B2 * 7/2007 Farooq et al. ................. 257/778
(Continued)

FOREIGN PATENT DOCUMENTS

JP       2012-156528     8/2012
KR    1020030046788 A    6/2003
(Continued)

OTHER PUBLICATIONS

Curtis Zwenger et al., "Surface Mount Assembly and Board Level Reliability for High Density POP (Package-on-Package) Utilizing Through Mold Via Interconnect Technology," Proceedings of the SMTA International Conference, Orlando, Florida, Aug. 17-21, 2008, pp. 1-10.

(Continued)

*Primary Examiner* — Jae Lee
*Assistant Examiner* — Mohammed R Alam
(74) *Attorney, Agent, or Firm* — Myers, Bigel & Sibley, P.A.

(57) ABSTRACT

In a package-on-package (PoP) device according to the inventive concepts, an anisotropic conductive film is disposed between a lower semiconductor package and an upper semiconductor package to remove an air gap between the lower and upper semiconductor packages. Thus, heat generated from a lower semiconductor chip may be rapidly and smoothly transmitted toward the upper semiconductor package, thereby increasing or maximizing a heat exhaust effect of the PoP device.

10 Claims, 22 Drawing Sheets

(51) Int. Cl.
*H01L 23/498* (2006.01)
*H01L 21/48* (2006.01)
*H01L 23/538* (2006.01)
*H01L 23/552* (2006.01)
*H01L 25/00* (2006.01)
*H01L 23/00* (2006.01)
*H01L 23/31* (2006.01)

(52) U.S. Cl.
CPC .............. *H01L24/16* (2013.01); *H01L 24/32* (2013.01); *H01L 24/48* (2013.01); *H01L 24/81* (2013.01); *H01L 24/83* (2013.01); *H01L 2224/12105* (2013.01); *H01L 2224/131* (2013.01); *H01L 2224/16225* (2013.01); *H01L 2224/16227* (2013.01); *H01L 2224/211* (2013.01); *H01L 2224/28105* (2013.01); *H01L 2224/29006* (2013.01); *H01L 2224/2929* (2013.01); *H01L 2224/2939* (2013.01); *H01L 2224/29344* (2013.01); *H01L 2224/29355* (2013.01); *H01L 2224/29444* (2013.01); *H01L 2224/29455* (2013.01); *H01L 2224/29499* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/81801* (2013.01); *H01L 2224/83101* (2013.01); *H01L 2224/83203* (2013.01); *H01L 2224/83851* (2013.01); *H01L 2225/06506* (2013.01); *H01L 2225/06568* (2013.01); *H01L 2225/107* (2013.01); *H01L 2225/1023* (2013.01); *H01L 2225/1035* (2013.01); *H01L 2225/1058* (2013.01); *H01L 2225/1094* (2013.01); *H01L 2924/01028* (2013.01); *H01L 2924/01079* (2013.01); *H01L 2924/12042* (2013.01); *H01L 2924/14* (2013.01); *H01L 2924/1431* (2013.01); *H01L 2924/1432* (2013.01); *H01L 2924/1434* (2013.01); *H01L 2924/15311* (2013.01); *H01L 2924/15331* (2013.01); *H01L 2924/18161* (2013.01)

(56) References Cited

U.S. PATENT DOCUMENTS

| | | | |
|---|---|---|---|
| 7,405,105 | B2 | 7/2008 | Han et al. |
| 8,035,235 | B2 | 10/2011 | Jang et al. |
| 8,362,607 | B2 | 1/2013 | Scheid et al. |
| 2003/0038366 | A1* | 2/2003 | Kozono ................. 257/723 |
| 2007/0057358 | A1* | 3/2007 | Satou ............. H01L 25/0657 257/686 |
| 2008/0211079 | A1* | 9/2008 | Onodera ............. H01L 25/105 257/686 |
| 2008/0236882 | A1* | 10/2008 | Ono ........................... 174/267 |
| 2009/0039905 | A1 | 2/2009 | Kimura et al. |
| 2009/0134510 | A1* | 5/2009 | Kim ................... H01L 25/105 257/698 |
| 2010/0012934 | A1 | 1/2010 | Jung |
| 2010/0019368 | A1 | 1/2010 | Shin |
| 2010/0308461 | A1 | 12/2010 | Galera et al. |
| 2012/0013007 | A1 | 1/2012 | Hwang et al. |
| 2012/0119372 | A1* | 5/2012 | Yasukawa ........... H01L 21/563 257/773 |
| 2013/0069239 | A1 | 3/2013 | Kim et al. |
| 2013/0069245 | A1* | 3/2013 | Uchiyama ................ 257/774 |

FOREIGN PATENT DOCUMENTS

| | | |
|---|---|---|
| KR | 1020070102716 A | 10/2007 |
| KR | 1020090028230 A | 3/2009 |
| KR | 1020090096184 A | 9/2009 |
| KR | 1020100009041 A | 1/2010 |
| KR | 1020100011648 A | 2/2010 |
| KR | 1020100030499 A | 3/2010 |
| KR | 1020100069001 A | 6/2010 |
| KR | 1020120007840 A | 1/2012 |

OTHER PUBLICATIONS

Moody Dreiza et al., Joint Project for Mechanical Qualification of Next Generation High Density Package-on-Package (PoP) with Through Mold Via Technology, pp. 1-8.

E. Jan Vardaman et al., Advanced Packaging Interconnect Trends and Technology Developments, TechSearch International, Inc., pp. 1-38.

* cited by examiner

PACKAGE-ON-PACKAGE DEVICES, METHODS OF FABRICATING THE SAME, AND SEMICONDUCTOR PACKAGES

CROSS-REFERENCE TO RELATED APPLICATION

This U.S. non-provisional patent application claims priority under 35 U.S.C. §119 to Korean Patent Application No. 10-2013-0103460, filed on Aug. 29, 2013, in the Korean Intellectual Property Office, the disclosure of which is incorporated by reference herein in its entirety.

BACKGROUND

The inventive concepts relate to package-on-package (PoP) devices, methods of fabricating the same, and semiconductor packages.

There is an increased demand for high performance, high speed and/or small electronic components. Multi-chip package techniques and/or package-on-package (PoP) technique have been proposed as semiconductor mounting techniques for satisfying this increased demand. A package-on-package (PoP) device fabricated by the PoP technique includes a lower package and an upper package that is stacked on the lower package. Each of the lower and upper packages includes a semiconductor chip and a package substrate therein. Thus, a PoP device may have an increased thickness. Because of this increased thickness, it may be difficult to exhaust heat that is generated by the semiconductor chips in a PoP device. Excessive heat build-up may cause the PoP device to operate incorrectly and/or may reduce an operating speed of the PoP device.

SUMMARY

Embodiments of the inventive concepts may provide package-on-package (PoP) devices with improved heat exhaust characteristics.

Embodiments of the inventive concepts may also provide method of forming such PoP devices.

In one aspect, a package-on-package (PoP) device may include: a lower semiconductor package and an upper semiconductor package which is stacked on top of the lower semiconductor package; and an anisotropic conductive film disposed between the lower semiconductor package and the upper semiconductor package. The anisotropic conductive film electrically connects the lower semiconductor package to the upper semiconductor package.

In some embodiments, the anisotropic conductive film may substantially fill a space between the lower semiconductor package and the upper semiconductor package.

In some embodiments, the lower semiconductor package may include: a lower package substrate; a lower semiconductor chip mounted on the lower package substrate; a connecting member disposed at a side of the lower semiconductor chip and electrically connecting the lower semiconductor package to the upper semiconductor package; and a lower mold layer covering a sidewall of the connecting member and the lower semiconductor chip. A top end of the connecting member may be disposed at the same level as or a higher level than a top surface of the lower mold layer.

In some embodiments, the upper semiconductor package may include an upper package substrate, and the upper package substrate may include an upper conductive pattern disposed on a bottom surface of the upper package substrate and vertically overlapping with the connecting member. The anisotropic conductive film may include a resin layer and conductive particles dispersed in the resin layer. Some of the conductive particles may be disposed between the upper conductive pattern and the connecting member.

In some embodiments, the conductive particles between the upper conductive pattern and the connecting member may have thicknesses less than those of the conductive particles that are spaced apart from the upper conductive pattern and the connecting member.

In some embodiments, the conductive particles between the upper conductive pattern and the connecting member may have elliptical cross sections, and the conductive particles spaced apart from the upper conductive pattern and the connecting member may have substantially spherical cross sections.

In some embodiments, the conductive particles may include at least one of a metal particle and an insulating particle coated with at least one conductive layer.

In some embodiments, the connecting member may be a solder ball, a through-mold conductive via, or a conductive stud.

In some embodiments, the lower mold layer may be in contact with a sidewall of the lower semiconductor chip and may expose a top surface of the lower semiconductor chip, and the anisotropic conductive film may be in direct physical contact with the top surface of the lower semiconductor chip.

In some embodiments, the PoP device may further include: a solder ball adhered to a top end of the connecting member.

In some embodiments, the PoP device may further include: an interposer substrate disposed between the lower semiconductor package and the upper semiconductor package. The anisotropic conductive film may be disposed between the lower semiconductor package and the interposer substrate or between the upper semiconductor package and the interposer substrate. A second anisotropic conductive film may be provided so that an anisotropic conductive film is disposed between both (1) the lower semiconductor package and the interposer substrate and (2) between the upper semiconductor package and the interposer substrate.

In some embodiments, the PoP device may further include: a thermal interface material layer disposed on the upper semiconductor package; and a heat radiating plate disposed on the thermal interface material layer.

In some embodiments, the lower semiconductor package may include: a lower semiconductor chip including a lower bonding pad; a lower mold layer covering a sidewall and a top surface of the lower semiconductor chip; a lower redistribution pattern contacting the lower bonding pad and extending along bottom surfaces of the lower semiconductor chip and the lower mold layer; and a connecting member penetrating the lower mold layer and contacting the lower redistribution pattern. The upper semiconductor package may include: an upper semiconductor chip including an upper bonding pad; an upper mold layer covering a sidewall and a top surface of the upper semiconductor chip; and an upper redistribution pattern contacting the upper bonding pad and extending along bottom surfaces of the upper semiconductor chip and the upper mold layer. In this case, the anisotropic conductive film may electrically connect the connecting member to the upper redistribution pattern.

In another aspect, a method of fabricating a package-on-package (PoP) device may include: preparing a lower semiconductor package including a lower connecting terminal exposed at a top surface of the lower semiconductor package; preparing an upper semiconductor package including an upper connecting terminal exposed at a bottom surface of the upper semiconductor package; and mounting the upper semiconductor package on the lower semiconductor package by interposing an anisotropic conductive film between the upper semiconductor package and the lower semiconductor package.

In some embodiments, preparing the lower semiconductor package may include: mounting a lower semiconductor chip on a lower package substrate; forming a lower mold layer covering at least a sidewall of the lower semiconductor chip on the lower package substrate; removing a portion of the lower mold layer to form a mold through-hole; and forming a connecting member filling the mold through-hole.

In some embodiments, preparing the lower semiconductor package may include: forming a sacrificial layer including a hole on a lower package substrate; forming a connecting member filling the hole; removing the sacrificial layer; mounting a lower semiconductor chip on the lower package substrate; and forming a lower mold layer covering at least a sidewall of the lower semiconductor chip and a sidewall of the connecting member on the lower package substrate, the lower mold layer exposing a top surface of the connecting member.

In some embodiments, preparing the lower semiconductor package may include: mounting a lower semiconductor chip on a lower package substrate; forming a connecting member spaced apart from the lower semiconductor chip on the lower package substrate; forming a lower mold layer covering the connecting member; and removing a portion of the lower mold layer to expose at least a top surface of the connecting member.

In some embodiments, the method may further include: inserting a solder ball in the hole; and heating the solder ball and the connecting member to bond the solder ball to the connecting member.

In some embodiments, mounting the upper semiconductor package on the lower semiconductor package by interposing the anisotropic conductive film between the upper semiconductor package and the lower semiconductor package may include: disposing an anisotropic conductive film on the lower semiconductor package; disposing the upper semiconductor package on the anisotropic conductive film; and pressing the upper semiconductor package against the anisotropic conductive film while the anisotropic conductive film is heated to electrically connect the lower connecting terminal to the upper connecting terminal.

In some embodiments, the method may further include: interposing an interposer substrate between the anisotropic conductive film and the upper semiconductor package or between the lower semiconductor package and the anisotropic conductive film.

In some embodiments, the anisotropic conductive film may include a resin layer and conductive particles dispersed in the resin layer, and the anisotropic conductive film may be heated at a temperature equal to or higher than a melting point of the resin layer when the upper semiconductor package is pressed against the anisotropic conductive film.

In still another aspect, a semiconductor package may include: a package substrate; and a semiconductor chip mounted on the package substrate with an anisotropic conductive film interposed between the package substrate and the semiconductor chip.

In yet another aspect, a PoP device is provided that includes a first package substrate having a first semiconductor chip thereon and a second package semiconductor having a second semiconductor chip thereon. The second package substrate is between the first semiconductor chip and the second semiconductor chip. The device further includes a connecting layer formed of an electrically insulative material that is between the first semiconductor chip and the second package substrate. The connecting layer includes a plurality of conductive particles within the electrically insulative material.

In some embodiments, the first package substrate and the first semiconductor chip are part of a lower semiconductor package, and the lower semiconductor package further includes conductive connecting members that are exposed at a top surface thereof. The second package semiconductor and the second semiconductor chip are part of an upper semiconductor package, the upper semiconductor package further including a conductive pattern exposed at a bottom surface thereof. The connecting layer is interposed between the conductive connecting members and the conductive pattern.

In some embodiments, the portions of the connecting layer that are between the conductive connecting members and the conductive pattern are thinner than at least some other portions of the connecting layer that are not between the conductive connecting members and the conductive pattern.

In some embodiments, the distance between conductive connecting members and the conductive pattern is less than a diameter of the conductive particles.

In some embodiments, the second package substrate includes thermally conductive paths that are configured to exhaust heat that is transferred from the first semiconductor chip to the second package substrate through the connecting layer to outer edges of the second package substrate.

In some embodiments, the connecting layer is a thermally conductive layer.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
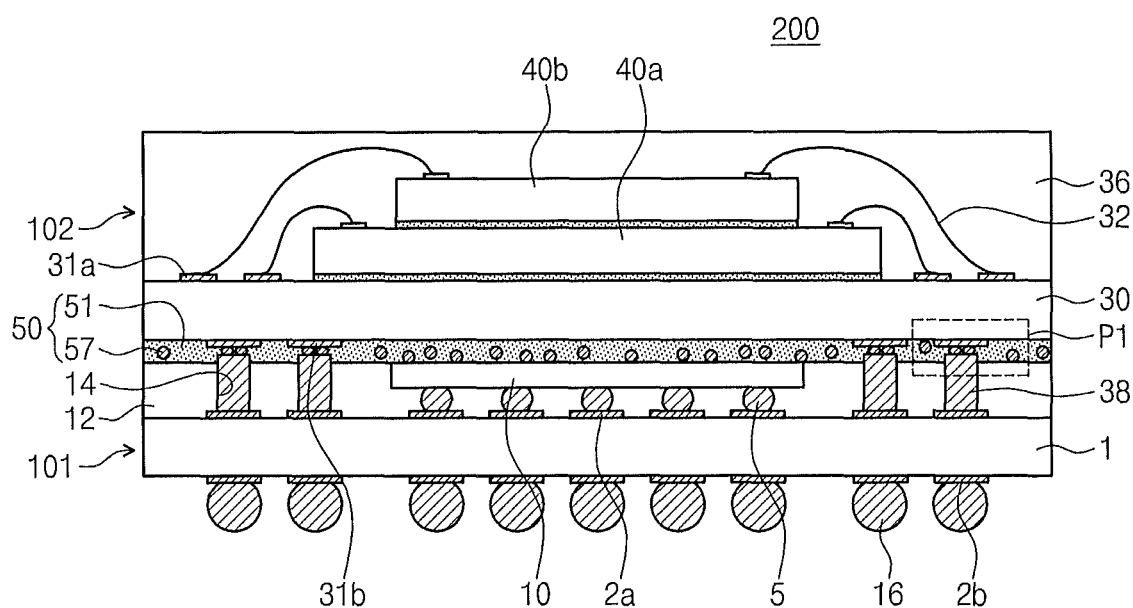
FIG. 1 is a cross-sectional view illustrating a package-on-package (PoP) device according to a first embodiment of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. In the drawings, embodiments of the inventive concepts are not limited to the specific examples provided herein and may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. The same reference numerals or designators denote the same elements throughout the specification.

Moreover, the exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

First Embodiment

FIG. 1 is a cross-sectional view illustrating a package-on-package (PoP) device according to a first embodiment of the inventive concepts.

Referring to FIG. 1, a package-on-package (PoP) device 200 according to the present embodiment includes a lower semiconductor package 101 and an upper semiconductor package 102.

The lower semiconductor package 101 includes a lower package substrate 1, a lower semiconductor chip 10 mounted on the lower package substrate 1, and a lower mold layer 12 covering the lower package substrate 1 and the lower semiconductor chip 10. The lower package substrate 1 may be a printed circuit board (PCB). First lower conductive patterns 2a are disposed on a top surface of the lower package substrate 1, and second lower conductive patterns 2b are disposed on a bottom surface of the lower package substrate 1. Even though not illustrated in the drawings, conductive vias (not shown) may be disposed in the lower package substrate 1. The conductive vias in the lower package substrate 1 may electrically connect the first lower conductive patterns 2a to the second lower conductive patterns 2b. Additionally, protection layers that partially expose the lower conductive patterns 2a and 2b may cover the respective top and bottom surfaces of the lower package substrate 1. Some of the lower conductive patterns 2a and 2b may function as ball pads, interconnections on which solder balls are disposed, or connecting terminals. The lower semiconductor chip 10 may be electrically connected to some of the first lower conductive patterns 2a through first lower solder bumps 5. The lower semiconductor chip 10 may be mounted on the lower package substrate 1 by a flip-chip bonding technique. The lower mold layer 12 may cover a sidewall of the lower semiconductor chip 10 but may expose a top surface of the lower semiconductor chip 10. In other words, the top surface of the lower semiconductor chip 10 may not be covered by the lower mold layer 12. The lower mold layer 12 includes connecting holes 14 exposing others of the first lower conductive patterns 2a. The lower semiconductor chip 10 may be, for example, a logic chip. The lower semiconductor chip 10 may include various devices such as a central processor unit (CPU), a graphic processor unit (GPU), and/or a universal serial bus (USB).

Figure 2:
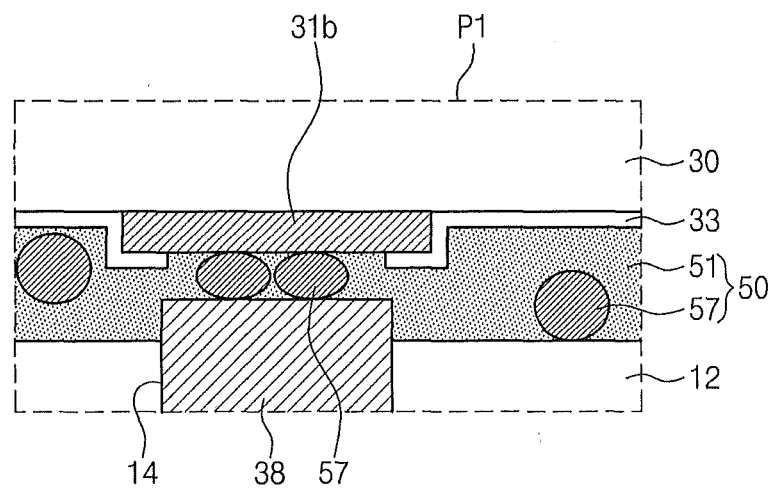
FIG. 2 is an enlarged view of a portion 'P1' of FIG. 1.

FIG. 2 is an enlarged view of a portion 'P1' of FIG. 1.

Referring to FIGS. 1 and 2, the upper semiconductor package 102 includes an upper package substrate 30, upper semiconductor chips 40a and 40b mounted on the upper package substrate 30, and an upper mold layer 36 covering the upper package substrate 30 and the upper semiconductor chips 40a and 40b. The upper package substrate 30 may be a printed circuit board. First upper conductive patterns 31a are disposed on a top surface of the upper package substrate 30, and second upper conductive patterns 31b are disposed on a bottom surface of the upper package substrate 30. Even though not illustrated in the drawings, conductive vias (not shown) may be disposed in the upper package substrate 30. The conductive vias in the upper package substrate 30 may electrically connect the first upper conductive patterns 31a to the second upper conductive patterns 31b. Protection layers 33 (see FIG. 2) that partially expose the upper conductive patterns 31a and 31b may cover the top surface and the bottom surface of the upper package substrate 30, respectively. The upper semiconductor chips 40a and 40b include a first upper semiconductor chip 40a and a second upper semiconductor chip 40b. The upper semiconductor chips 40a and 40b may be electrically connected to the first upper conductive patterns 31a of the upper package substrate 30 by a wire bonding technique. The upper semiconductor chips 40a and 40b may be, for example, memory chips. More than two upper semiconductor chips may be included in the upper semiconductor package 102.

The upper semiconductor package 102 is stacked on the lower semiconductor package 101. The upper and lower semiconductor packages 102 and 101 are electrically connected to each other through connecting members 38. The connecting members 38 are disposed in respective ones of the connecting holes 14. In the first embodiment, the connecting members 38 may be studs or through-mold vias. Even though not shown in the drawings, each of the connecting members 38 may include a seed layer conformally covering a sidewall and a bottom of each of the connecting holes 14. The connecting members 38 may be formed by a plating process or a deposition process. The connecting members 38 may be formed of at least one of gold, copper, nickel, tin, and lead. Top ends of the connecting members 38 may be disposed at substantially the same level as or at a higher level than a top surface of the lower mold layer 12. If the top ends of the connecting members 38 are higher than the top surface of the lower mold layer 12, the connecting members 38 may protrude upward from the top surface of the lower mold layer 12. The connecting members 38 may be vertically aligned with the second upper connective patterns 31b.

Figure 3:
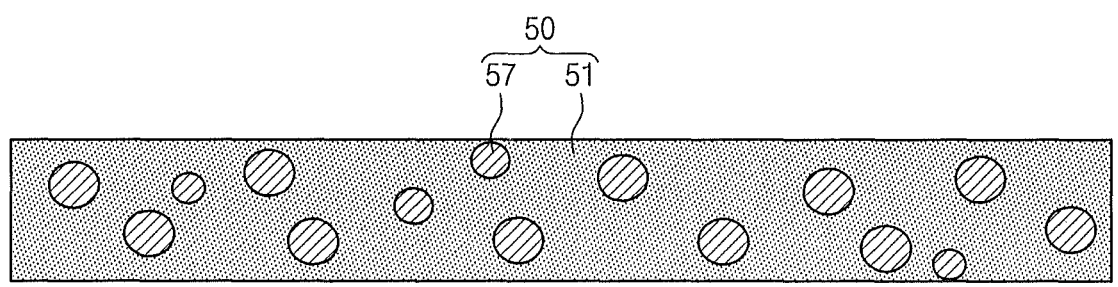
FIG. 3 is a cross-sectional view illustrating an anisotropic conductive film according to an embodiment of the inventive concepts.
Figure 4A:
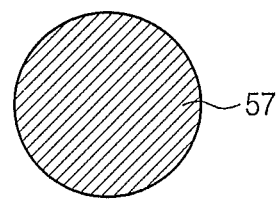
FIGS. 4A to 4E are perspective and cross-sectional views illustrating conductive particles of anisotropic conductive films according to embodiments of the inventive concepts.
Figure 4B:
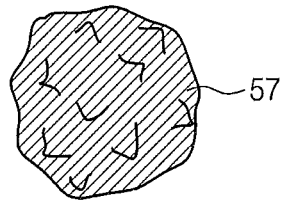
Figure 4C:
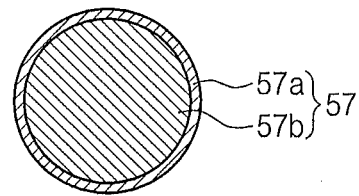
Figure 4D:
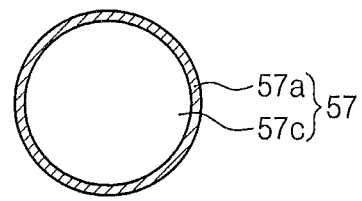
Figure 4E:
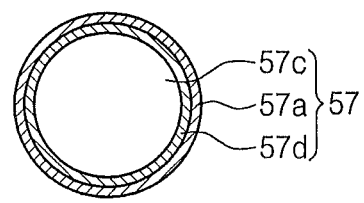

FIG. 3 is a cross-sectional view illustrating an anisotropic conductive film according to an embodiment of the inventive concepts. FIGS. 4A to 4E are perspective views and cross-sectional views illustrating conductive particles of anisotropic conductive films according to embodiments of the inventive concepts.

Referring to FIGS. 1-4, an anisotropic conductive film 50 is disposed between the upper semiconductor package 102 and the lower semiconductor package 101. The anisotropic conductive film 50 includes a resin layer 51 and conductive particles 57 that are dispersed in the resin layer 51. The resin layer 51 may include a polymer-based material that is melted by heat. In some embodiments, each of the conductive particles 57 may be a metal particle having a lump-shape, as illustrated in FIGS. 4A and 4B. In other embodiments, each of the conductive particles 57 may be a metal particle 57b that is coated with a conductive layer 57a, as illustrated in FIG. 4C. In still other embodiments, each of the conductive particles 57 may be an insulating particle 57c coated with one or more conductive layers 57a and 57d, as illustrated in FIGS. 4D and 4E. The metal particle and the conductive layers 57a and 57b may include gold or nickel. The insulating particle 57c may include plastic. The conductive particles 57 may have spherical shapes as illustrated in FIGS. 4A, 4C, 4D, and 4E. Alternatively, the conductive particles 57 may have dendrite-shapes having projections. Other shapes may also be used.

The anisotropic conductive film 50 fills a space between the upper semiconductor package 102 and the lower semiconductor package 101. Some of the conductive particles 57 are disposed between the connecting member 38 and the second upper conductive pattern 31b to electrically connect the connecting member 38 to the second upper conductive pattern 31b. Others of the conductive particles 57, which are not disposed between the connecting member 38 and the second upper conductive pattern 31b, are insulated from the connecting member 38 and the second upper conductive pattern 31b by the resin layer 51. The second upper conductive pattern 31b may be adhered to the upper package substrate 30 to protrude from the upper package substrate 30, and the top end of the connecting member 38 may protrude to be higher than the top surface of the lower mold layer 12. Thus, a distance between the second upper conductive pattern 31b and the connecting member 38 may be less than a distance between the upper package substrate 30 and the lower mold layer 12. As a result, the conductive particles 57 between the connecting member 38 and the second upper conductive pattern 31b may be flatter or thinner than the conductive particles that are not disposed between the connecting member 38 and the second upper conductive pattern 31b. In other words, the conductive particles 57 between the connecting member 38 and the second upper conductive pattern 31b may have elliptical cross-sections. In contrast, the conductive particles 57 that are not disposed between the connecting member 38 and the second upper conductive pattern 31b may have spherical shapes. The conductive particles 57 between the connecting member 38 and the second upper conductive pattern 31b may have a thickness less than that of the conductive particles 57 that are not disposed between the connecting member 38 and the second upper conductive pattern 31b.

Figure 5:
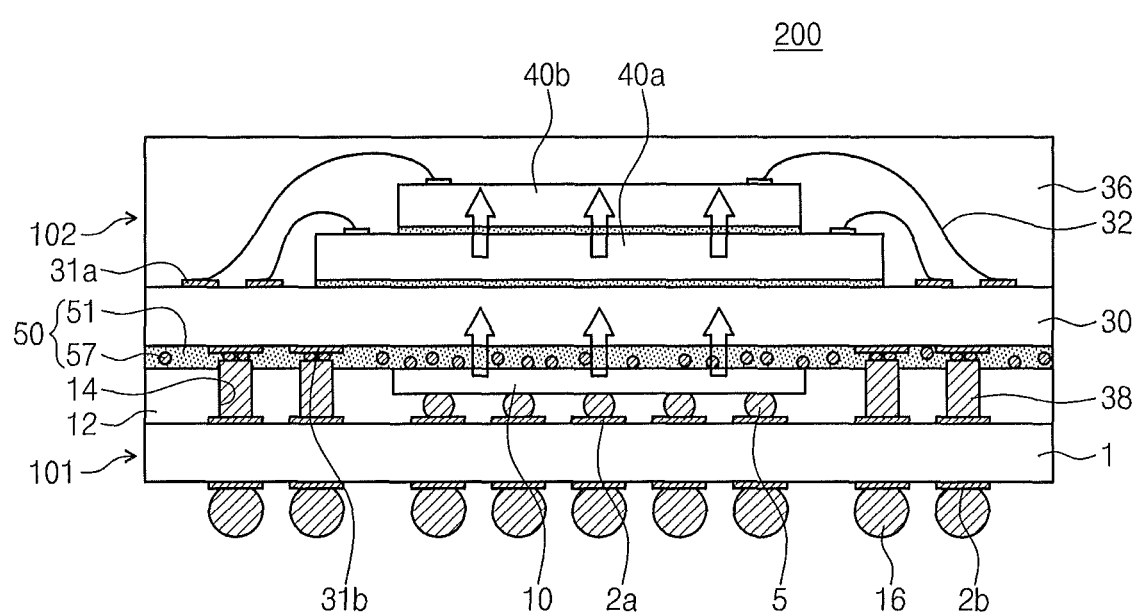
FIG. 5 is a cross-sectional view that illustrates heat transfer in the PoP device of FIG. 1.

FIG. 5 illustrates heat transfer that may occur during operation of the PoP device of FIG. 1.

Referring to FIG. 5, the anisotropic conductive film 50 is disposed between the lower semiconductor chip 10 (which may be a logic chip that may be the primary source of heat) and the upper package substrate 30 in the PoP device 200. The anisotropic conductive film 50 electrically connects the lower package substrate 1 to the upper package substrate 30. If the lower semiconductor package 101 is electrically connected to the upper semiconductor package 102 by solder balls as opposed to the anisotropic conductive film 50, an air gap is formed between the lower and upper semiconductor packages 101 and 102. The thermal conductivity of a gas such as air may be substantially lower than the thermal conductivity of a solid. Thus, if solder balls and an air gap are provided instead of the anisotropic conductive film 50, the heat generated from the lower semiconductor chip 10 may be less readily dissipated from the device. However, in embodiments of the inventive concepts, the anisotropic conductive film 50 is disposed between the lower and upper semiconductor packages 101 and 102. Thus, the heat generated from the lower semiconductor chip 10 may more readily be expelled through the anisotropic conductive film 50 as shown by the arrows of FIG. 5. As a result, an operating speed of the PoP device 200 may be improved and a false operation problem of the PoP device 200 may be prevented. Additionally, a start time of dynamic thermal management (DTM) may be delayed to increase or maximize use of the CPU. Furthermore, a frequency loss of the CPU may be reduced or minimized in the lower semiconductor chip 10.

Figure 6:
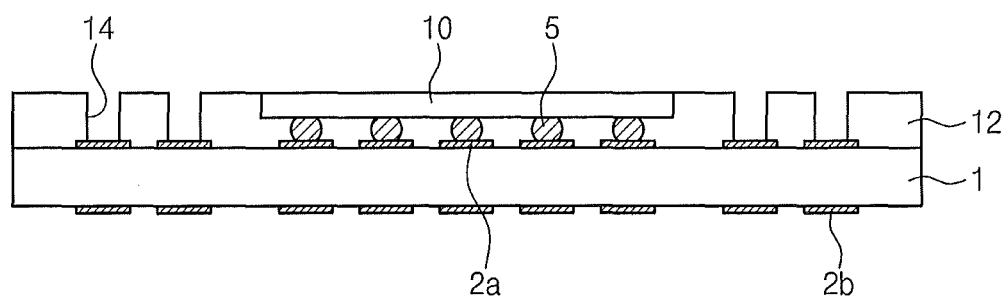
FIGS. 6 to 8 are cross-sectional views illustrating a method of fabricating the PoP device of FIG. 1 according to an embodiment of the inventive concepts.
Figure 7:
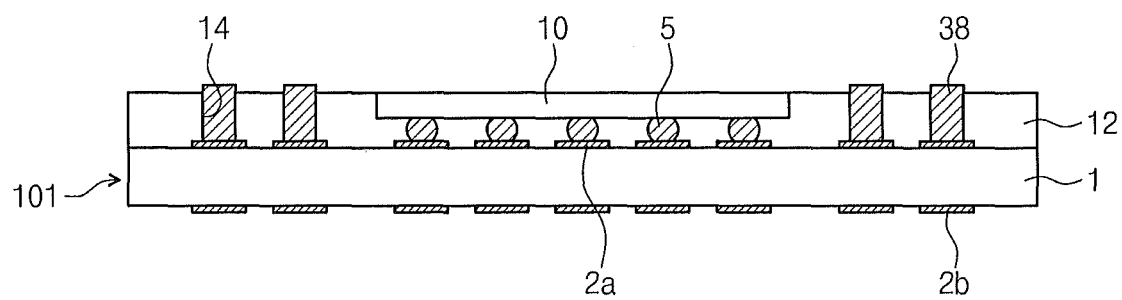
Figure 8:
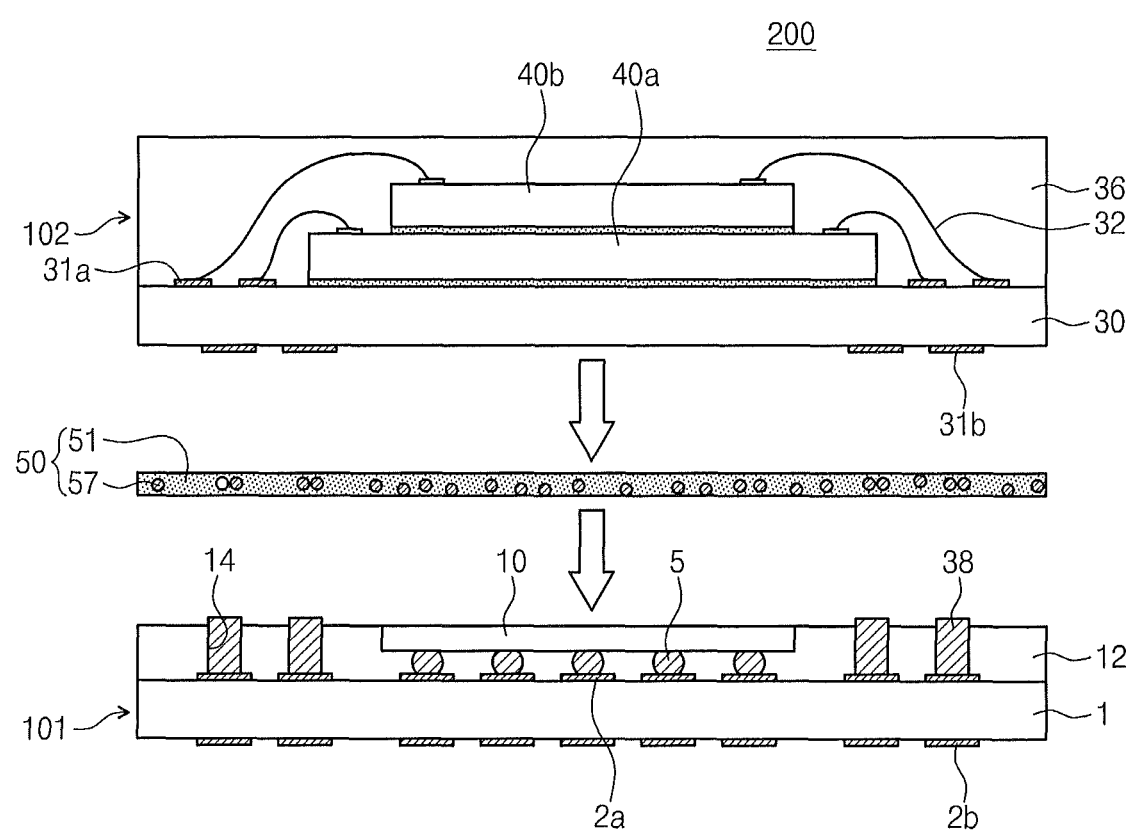

FIGS. 6 to 8 are cross-sectional views illustrating a method of fabricating the PoP device of FIG. 1.

Referring to FIG. 6, a lower package substrate 1 including first and second lower conductive patterns 2a and 2b is prepared. The first lower conductive patterns 2a are disposed on a top surface of the lower package substrate 1 and the second lower conductive patterns 2b are disposed on a bottom surface of the lower package substrate 1. A lower semiconductor chip 10 is mounted on the lower package substrate 1 with first lower solder bumps 5 therebetween by a flip-chip bonding technique. A lower mold layer 12 is formed to cover a sidewall of the lower semiconductor chip 10 and the top surface of the lower package substrate 1. The lower mold layer 12 may be formed to cover a top surface of the lower semiconductor chip 10. In this case, a chemical mechanical polishing (CMP) process may be performed on the lower mold layer 12 in order to expose the top surface of the lower semiconductor chip 10. Portions of the lower mold layer 12 are removed using, for example, a laser, to form connecting holes 14 that expose some of the first lower conductive patterns 2a.

Referring to FIG. 7, even though not shown in the drawings, a seed layer may be conformally formed on an entire surface of the lower mold layer 12. Subsequently, a plating process may be performed to form connecting members 38 that fill the connecting holes 14. Subsequently, the seed layer and the plating layer on the top surface of the lower mold layer 12 may be removed. In the present embodiment, top ends of the connecting members 38 may protrude to be higher than the top surface of the lower mold layer 12. Thus, a lower semiconductor package 101 may be formed before adhering second lower solder bumps 16 on the second lower conductive patterns 2b.

Referring to FIG. 8, a first upper semiconductor chip 40a and a second upper semiconductor chip 40b are sequentially stacked on an upper package substrate 30. The first and second upper semiconductor chips 40a and 40b are electrically connected to the upper package substrate 30 by wires 32. A mold process is performed to form an upper mold layer 36 covering the upper semiconductor chips 40a and 40b. An anisotropic conductive film 50 and the upper semiconductor package 102 are sequentially stacked on the lower semiconductor package 101. The anisotropic conductive film 50 may be the same as described with reference to FIG. 1. The anisotropic conductive film 50 is heated at a temperature equal to or higher than of a melting point of the resin layer 51 and the upper semiconductor package 102 is pressed downward. Thus, the conductive particles 57 between the second upper conductive pattern 31b and the connecting member 38 are pressed and the upper conductive pattern 31b is electrically connected to the connecting member 38, as illustrated in FIGS. 1 and 2. Additionally, the anisotropic conductive film 50 may sufficiently fill a space between the packages 101 and 102 without an air gap.

Referring again to FIG. 1, second lower solder bumps 16 are bonded to the second lower conductive patterns 2b disposed on the bottom surface of the lower package substrate 1, respectively. Thus, the PoP device 200 may be fabricated.

FIGS. 9 to 13 are cross-sectional views illustrating a method of fabricating the PoP device of FIG. 1 according to another embodiment of the inventive concepts.

Figure 9:
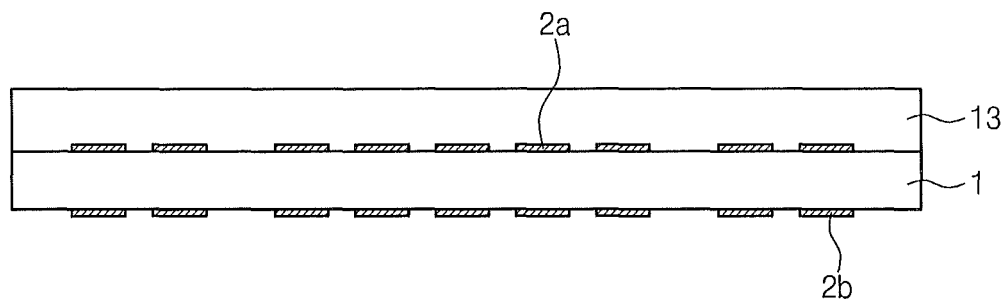
FIGS. 9 to 13 are cross-sectional views illustrating a method of fabricating the PoP device of FIG. 1 according to another embodiment of the inventive concepts.

Referring to FIG. 9, a lower package substrate 1 including first and second lower conductive patterns 2a and 2b is prepared. The first lower conductive patterns 2a are disposed on a top surface of the lower package substrate 1, and the second lower conductive patterns 2b are disposed on a bottom surface of the lower package substrate 1. A sacrificial layer 13 is formed on the top surface of the lower package substrate 1. The sacrificial layer 13 may be a photoresist layer.

Figure 10:
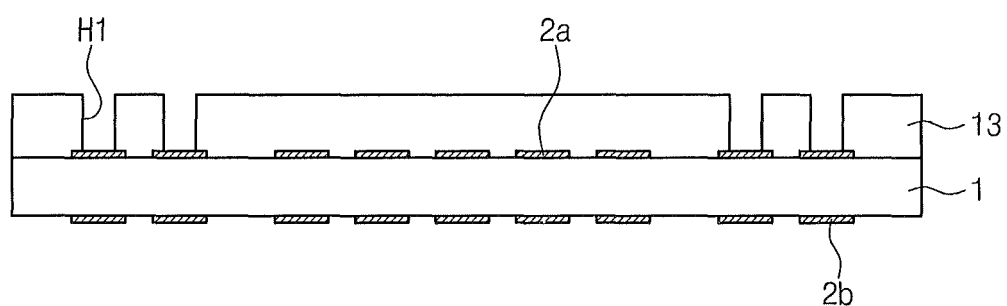

Referring to FIG. 10, portions of the sacrificial layer 13 are removed to form holes H1 that expose some of the first lower conductive patterns 2a. If the sacrificial layer 13 is the photoresist layer, the portions of the sacrificial layer 13 may be removed by an exposure process and a development process.

Figure 11:
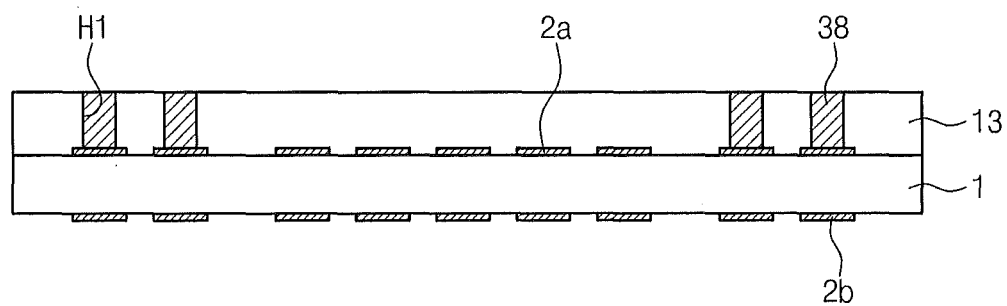

Referring to FIG. 11, even though not shown in the drawings, a seed layer may be conformally formed on an entire surface of the sacrificial layer 13. Subsequently, a plating process may be performed to form connecting members 38 filling the holes H1. Next, the seed layer and the plating layer on a top surface of the sacrificial layer 13 may be removed.

Figure 12:
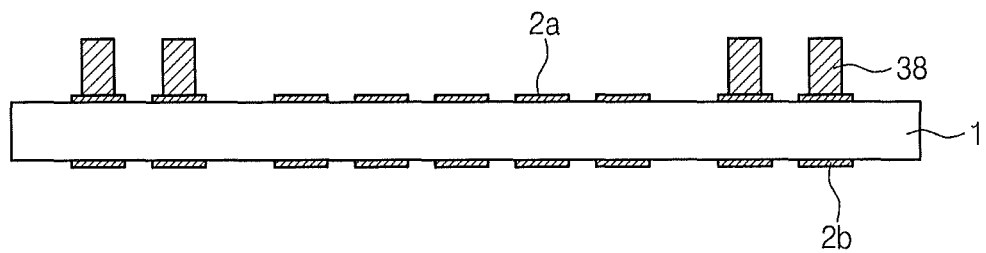

Referring to FIG. 12, the sacrificial layer 13 is selectively removed. If the sacrificial layer 13 is the photoresist layer, the sacrificial layer 13 may be removed by an ashing process. Removal of the sacrificial layer exposes others of the first lower conductive patterns 2a that do not contact the connecting members 38.

Figure 13:
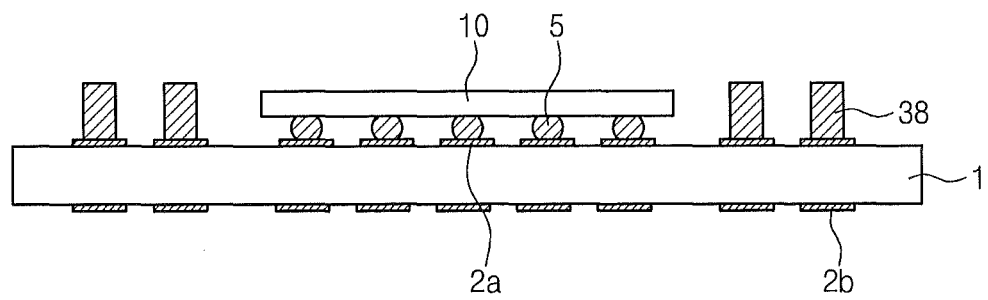

Referring to FIG. 13, a lower semiconductor chip 10 is mounted on the first lower conductive patterns 2a that do not contact the connecting members via first lower solder bumps 5.

Referring again to FIG. 7, a molding process is performed to form a lower mold layer 12 on the lower package substrate 1. The lower mold layer 12 covers a sidewall of the lower semiconductor chip 12 and portions of sidewalls of the connecting members 38. The lower mold layer 12 exposes at least upper portions of the connecting members 38. As a result, the lower semiconductor package 101 is formed.

Next, the anisotropic conductive film 50 and the upper semiconductor package 102 are sequentially stacked on the lower semiconductor package 101 and then are pressed using heat, as described with reference to FIG. 8.

Second Embodiment

Figure 14:
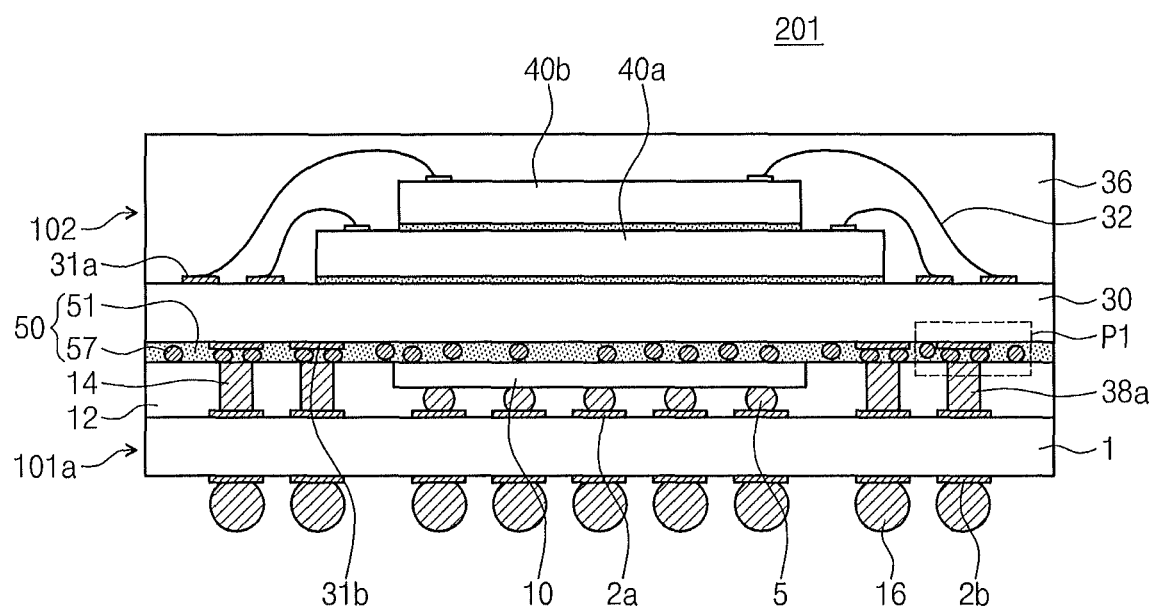
FIG. 14 is a cross-sectional view illustrating a PoP device according to a second embodiment of the inventive concepts.
Figure 15:
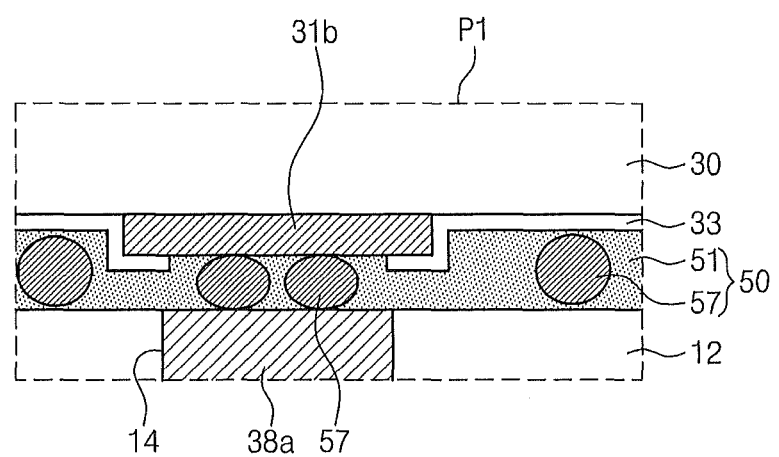
FIG. 15 is an enlarged view of a portion 'P1' of FIG. 14.

FIG. 14 is a cross-sectional view illustrating a PoP device 201 according to a second embodiment of the inventive concepts. FIG. 15 is an enlarged view of a portion P1' of FIG. 14.

Referring to FIGS. 14 and 15, top surfaces of connecting members 38a may be disposed at the same level as the top surface of the lower mold layer 12 in a lower semiconductor package 101a of the PoP device 201 according to the present embodiment. In other words, the top surfaces of the connecting members 38a may be coplanar with the top surface of the lower mold layer 12. Other elements of the PoP device 201 may be the same as or similar to corresponding elements of the PoP device 200 in the first embodiment.

A plating process is performed on the structure of FIG. 6 to form the connecting members 38a and then a planarization etching process such as a CMP process is performed on the connecting members 38a. Thus, the connecting members 38a have top surfaces disposed at the same level as the top surface of the lower mold layer 12. Subsequent processes for the formation of the PoP device 201 may be the same as or similar to corresponding processes of the first embodiment.

Third Embodiment

Figure 16:
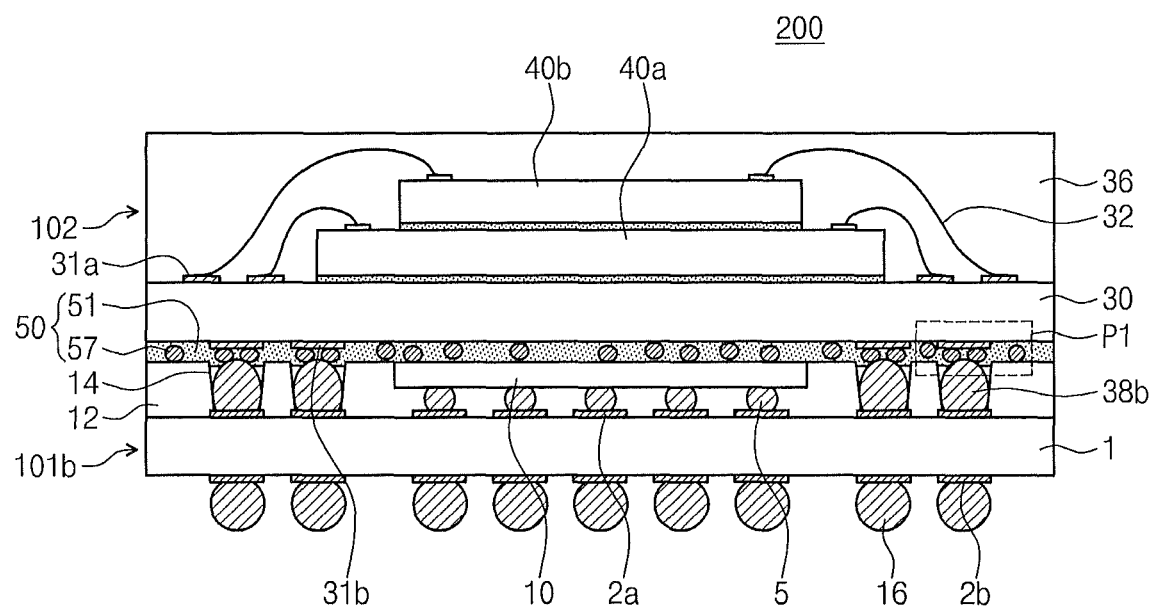
FIG. 16 is a cross-sectional view illustrating a PoP device according to a third embodiment of the inventive concepts.
Figure 17:
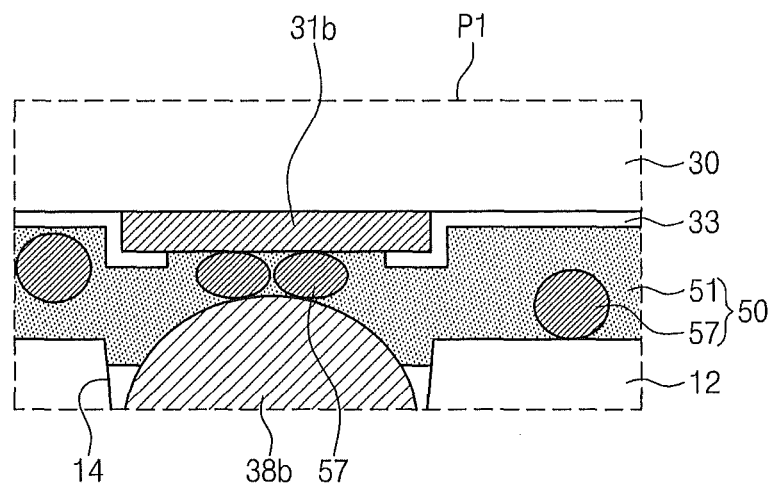
FIG. 17 is an enlarged view of a portion 'P1' of FIG. 16.

FIG. 16 is a cross-sectional view illustrating a PoP device according to a third embodiment of the inventive concepts. FIG. 17 is an enlarged view of a portion 'P1' of FIG. 16.

Referring to FIGS. 16 and 17, connecting members 38b may be solder balls in a lower semiconductor package 101b of a PoP device 202 according to the present embodiment. Thus, the connecting member 38b may have a curved surface. In this case, a top end of the connecting member 38b may be disposed at the same level as the top surface of the lower mold layer 12 or may protrude from the top surface of the lower mold layer 12. Other elements of the PoP device 202 may be the same as or similar to corresponding elements of the PoP device 200 in the first embodiment.

Figure 18:
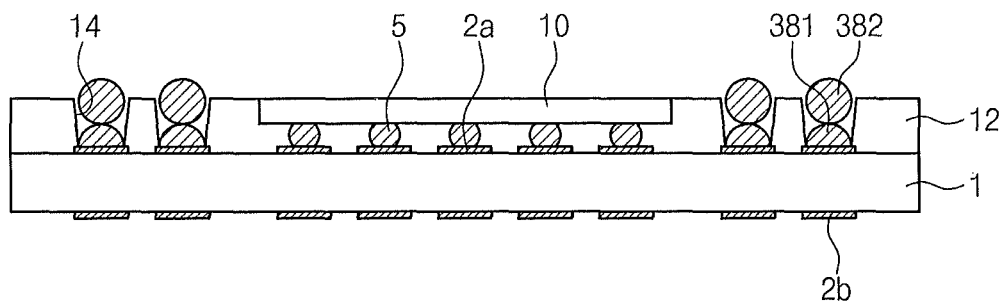
FIGS. 18 and 19 are cross-sectional views illustrating a method of fabricating the PoP device of FIG. 16.
Figure 19:
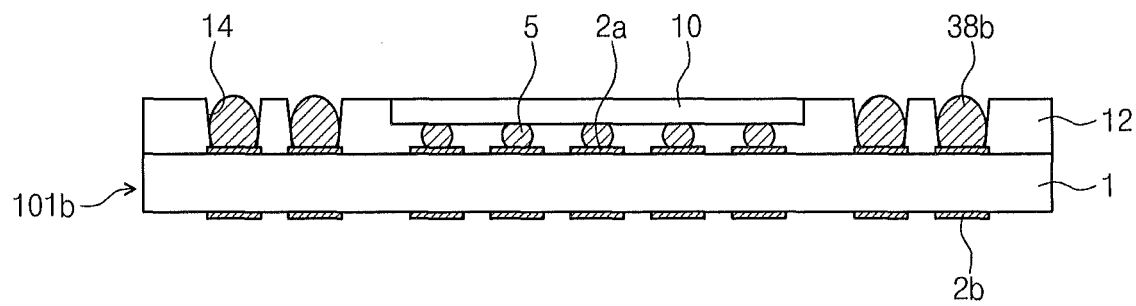

FIGS. 18 and 19 are cross-sectional views illustrating a method of fabricating the PoP device of FIG. 16.

Referring to FIG. 18, a lower package substrate 1 including first and second lower conductive patterns 2a and 2b on its top and bottom surfaces is prepared. A lower semiconductor chip 10 is mounted on some of the first lower conductive patterns 2a through first lower solder bumps 5. First connecting solder balls 381 are adhered to the first lower conductive patterns 2a that do not contact the first lower solder bumps 5. A mold process is performed to form a lower mold layer 12 that covers a top surface of the lower package substrate 1 and at least a sidewall of the lower semiconductor chip 10. Portions of the lower mold layer 12 are removed to form connecting holes 14 that expose the first connecting solder balls 381. Subsequently, second connecting solder balls 382 are formed in the respective connecting holes 14.

Referring to FIG. 19, the connecting solder balls 381 and 382 are heated at a temperature equal to or higher than their melting point, so that the connecting solder balls 381 and 382 are melted and bonded to each other, thereby forming connecting members 38b. Thus, top ends of the connecting members 38b may protrude to be higher than the top surface of the lower mold layer 12. Subsequent processes of the present embodiment may be the same as or similar to corresponding processes of the first embodiment.

Alternatively, the first connecting solder balls 381 are large such that top ends of the first connecting solder balls 381 protrude from the top surface of the lower mold layer 12. In this case, the second connecting solder balls 382 may not be used for the formation of the connecting members 38b.

Fourth Embodiment

Figure 20:
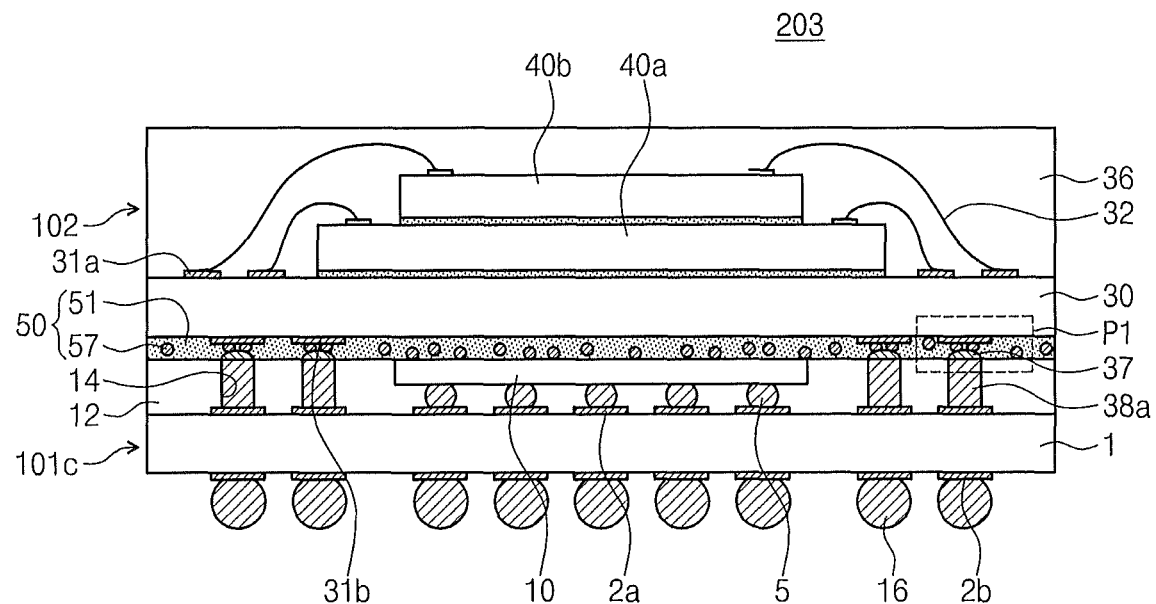
FIG. 20 is a cross-sectional view illustrating a PoP device according to a fourth embodiment of the inventive concepts.
Figure 21:
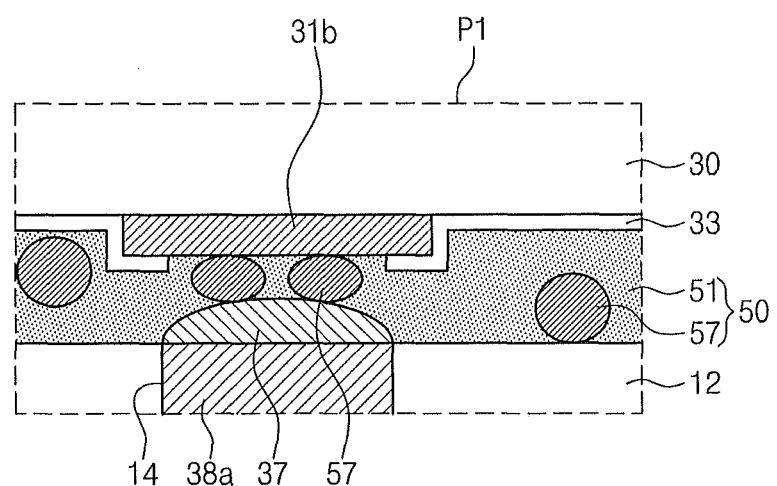
FIG. 21 is an enlarged view of a portion 'P1' of FIG. 20.

FIG. 20 is a cross-sectional view illustrating a PoP device according to a fourth embodiment of the inventive concepts. FIG. 21 is an enlarged view of a portion 'P1' of FIG. 20.

Referring to FIGS. 20 and 21, the connecting members 38a may be the same as those of the second embodiment and supplementary solder balls 37 may be respectively adhered to top ends of the connecting members 38a in a lower semiconductor package 101c of a PoP device 203 according to the present embodiment. Conductive particles 57 of an anisotropic conductive film 50 may be disposed between the supplementary solder balls 37 and the respective second upper conductive patterns 31b. Other elements of the PoP device 203 may be the same as or similar to corresponding elements of the PoP device 201 in the second embodiment.

Figure 22:
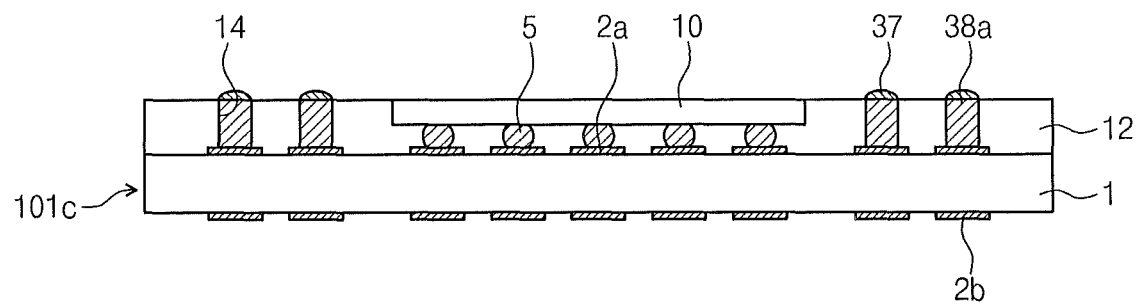
FIG. 22 is a cross-sectional view illustrating a method of fabricating the PoP device of FIG. 20.

FIG. 22 is a cross-sectional view illustrating a method of fabricating the PoP device of FIG. 20.

Referring to FIG. 22, a plating process is performed on the structure of FIG. 6 to form connecting members 38a and then a planarization etching process such as a CMP process is performed on the connecting members 38a. Thus, the connecting members 38a have top surfaces disposed at the same level as the top surface of the lower mold layer 12. Next, supplementary solder balls 37 are bonded to the top surfaces of the respective connecting members 38a. Subsequent processes for the formation of the PoP device 203 may be the same as or similar to corresponding processes of the second embodiment.

Fifth Embodiment

Figure 23:
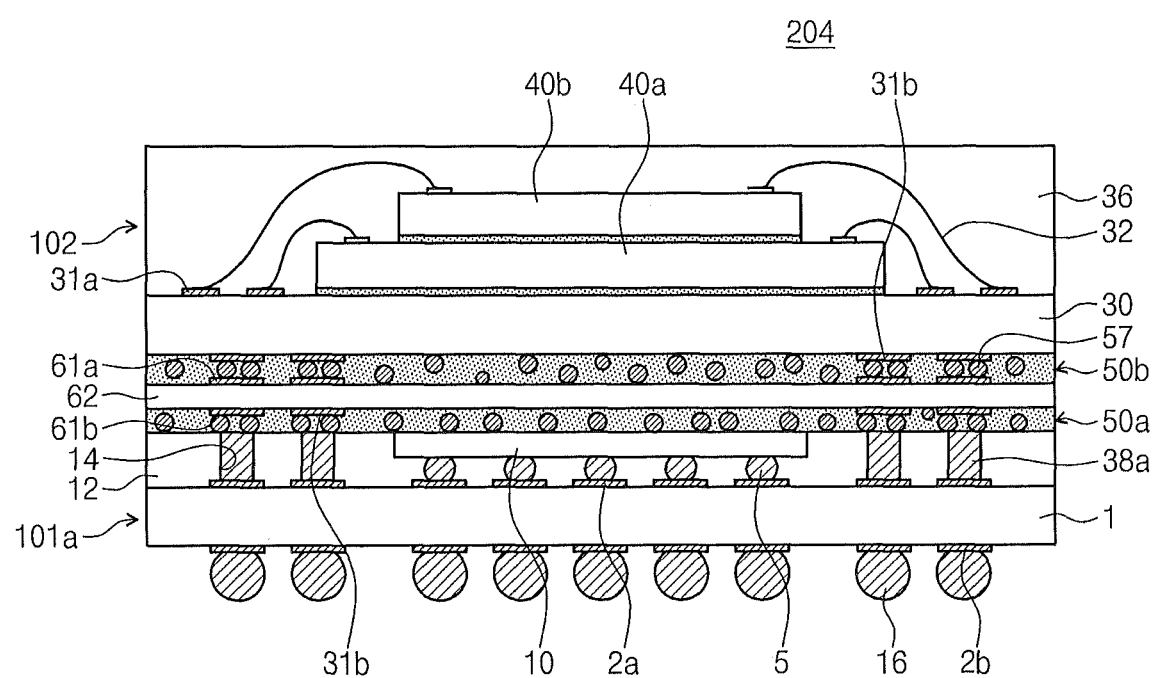
FIG. 23 is a cross-sectional view illustrating a PoP device according to a fifth embodiment of the inventive concepts.

FIG. 23 is a cross-sectional view illustrating a PoP device according to a fifth embodiment of the inventive concepts.

Referring to FIG. 23, an interposer substrate 62 is disposed between a lower semiconductor package 101a and an upper semiconductor package 102 in a PoP device 204 according to the present embodiment. The interposer substrate 62 may be printed circuit board. The interposer substrate 62 may comprise a plastic, a flexible film or a ceramic. The interposer substrate 62 may include first conductive patterns 61a disposed on its top surface and second conductive patterns 61b disposed on its bottom surface. The first conductive patterns 61a may vertically overlap with second upper conductive patterns 31b, respectively. The first conductive patterns 61a may be electrically connected to the second upper conductive patterns 31b through conductive particles 57 of a second anisotropic conductive film 50b that is disposed therebetween. The second conductive patterns 61b may be vertically aligned with the respective connecting members 38a. The second conductive patterns 61b may be electrically connected to the connecting members 38a through the conductive particles 57 of a first anisotropic conductive film 50a therebetween. The first and second conductive patterns 61a and 61b may be electrically connected to each other through conductive vias or other conductive structures that are disposed within the interposer substrate 62 (not shown). The first anisotropic conductive film 50a may be disposed between the lower semiconductor package 101a and the interposer substrate 62. The second anisotropic conductive film 50b may be disposed between the interposer substrate 62 and the upper semiconductor package 102. Each of the first and second anisotropic conductive films 50a and 50b may be the same as or similar to the anisotropic conductive film 50 of the first embodiment. Other elements of the PoP device 204 may be the same as or similar to corresponding elements of the second embodiment.

Figure 24:
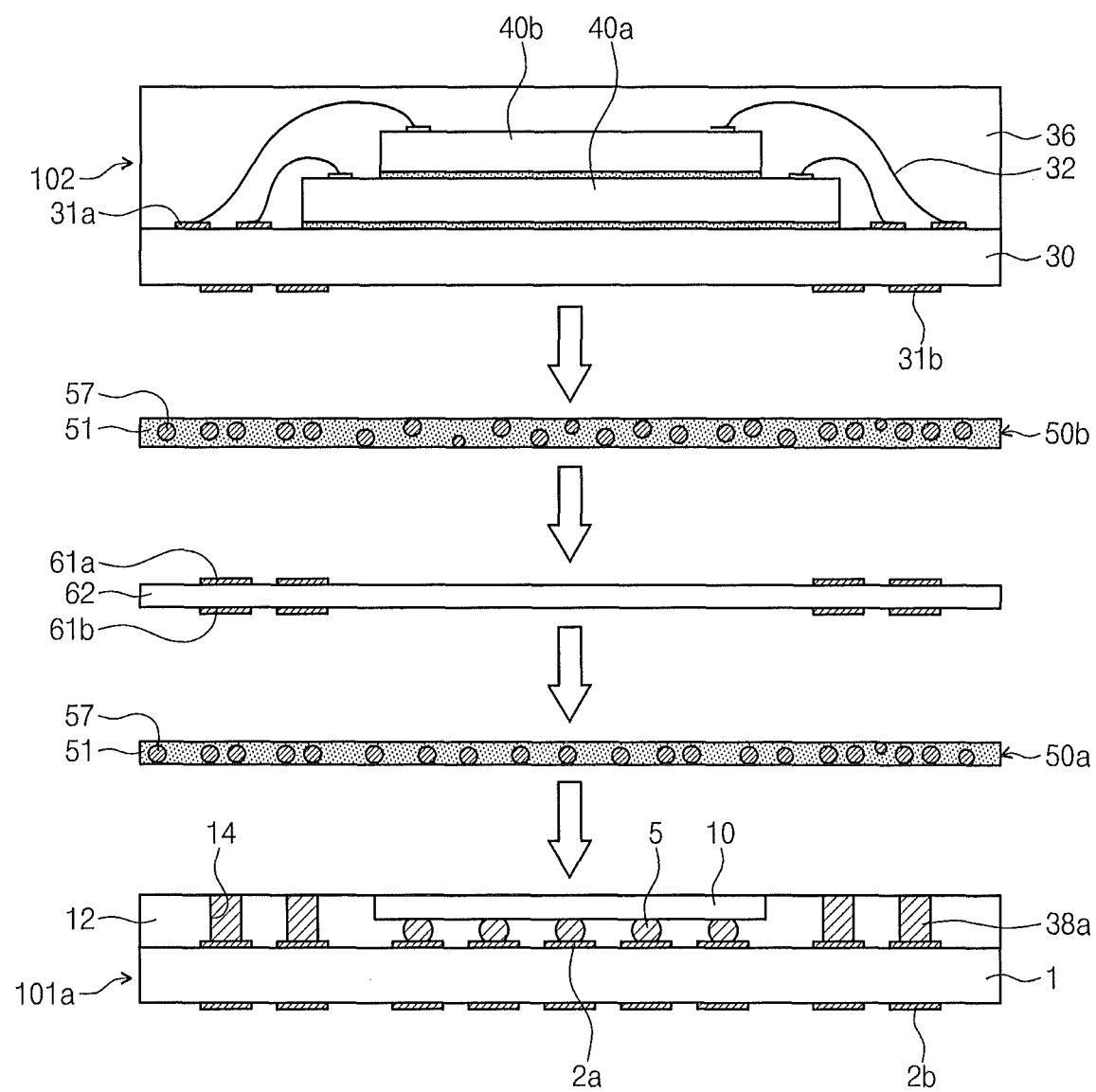
FIG. 24 is a cross-sectional view illustrating a method of fabricating the PoP device of FIG. 23.

FIG. 24 is a cross-sectional view illustrating a method of fabricating the PoP device of FIG. 23.

Referring to FIG. 24, a first anisotropic conductive film 50a, an interposer substrate 62, a second anisotropic conductive film 50b, and an upper semiconductor package 102 are sequentially stacked on a lower semiconductor package 101a and then are pressed using heat. Other fabricating processes in the present embodiment may be the same as or similar to corresponding fabricating processes of the second embodiment.

Sixth Embodiment

Figure 25:
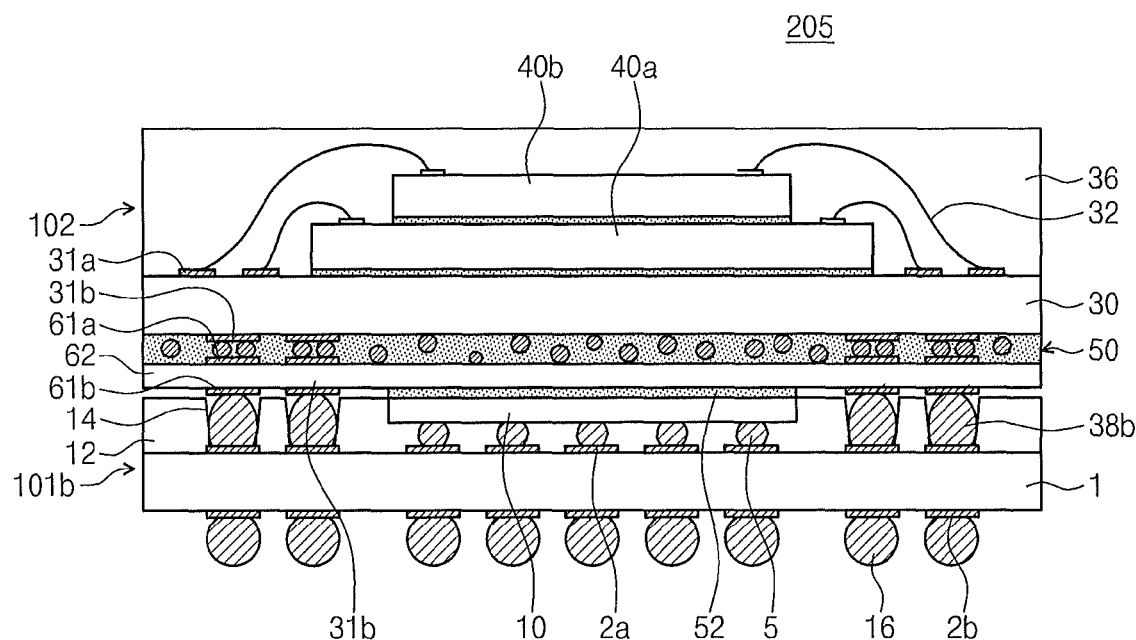
FIG. 25 is a cross-sectional view illustrating a PoP device according to a sixth embodiment of the inventive concepts.

FIG. 25 is a cross-sectional view illustrating a PoP device according to a sixth embodiment of the inventive concepts.

Referring to FIG. 25, an interposer substrate 62 is disposed between the lower semiconductor package 101b and the upper semiconductor package 102 of FIG. 16 in a PoP device 205 according to the present embodiment. An anisotropic conductive film 50 is disposed between the interposer substrate 62 and the upper semiconductor package 102. A thermal interface material layer 52 is disposed between the lower semiconductor package 101b and the interposer substrate 62. Connecting members 38b may be in direct contact with the second conductive patterns 61b of the interposer substrate 62. Other elements and fabricating processes of the PoP device 205 may be the same as or similar to corresponding elements and corresponding fabricating processes of the fifth embodiment.

Seventh Embodiment

Figure 26:
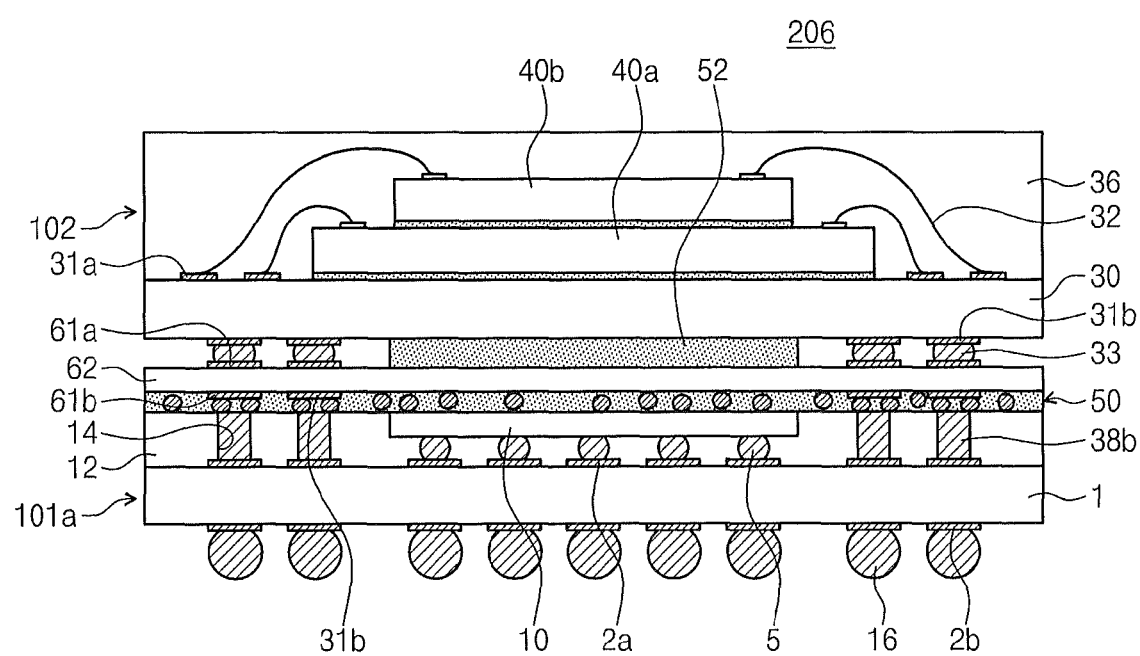
FIG. 26 is a cross-sectional view illustrating a PoP device according to a seventh embodiment of the inventive concepts.

FIG. 26 is a cross-sectional view illustrating a PoP device according to a seventh embodiment of the inventive concepts.

Referring to FIG. 26, an interposer substrate 62 is disposed between the lower semiconductor package 101a and the upper semiconductor package 102 of FIG. 14 in a PoP device 206 according to the present embodiment. A thermal interface material layer 52 is disposed between the interposer substrate 62 and the upper semiconductor package 102. An anisotropic conductive film 50 is disposed between the lower semiconductor package 101a and the interposer substrate 62. Second upper conductive patterns 31b are electrically connected to first conductive patterns 61a through assistant connecting members 33. Other elements and fabricating processes of the PoP device 206 may be the same as or similar to corresponding elements and corresponding fabricating processes of the fifth embodiment.

Eighth Embodiment

Figure 27:
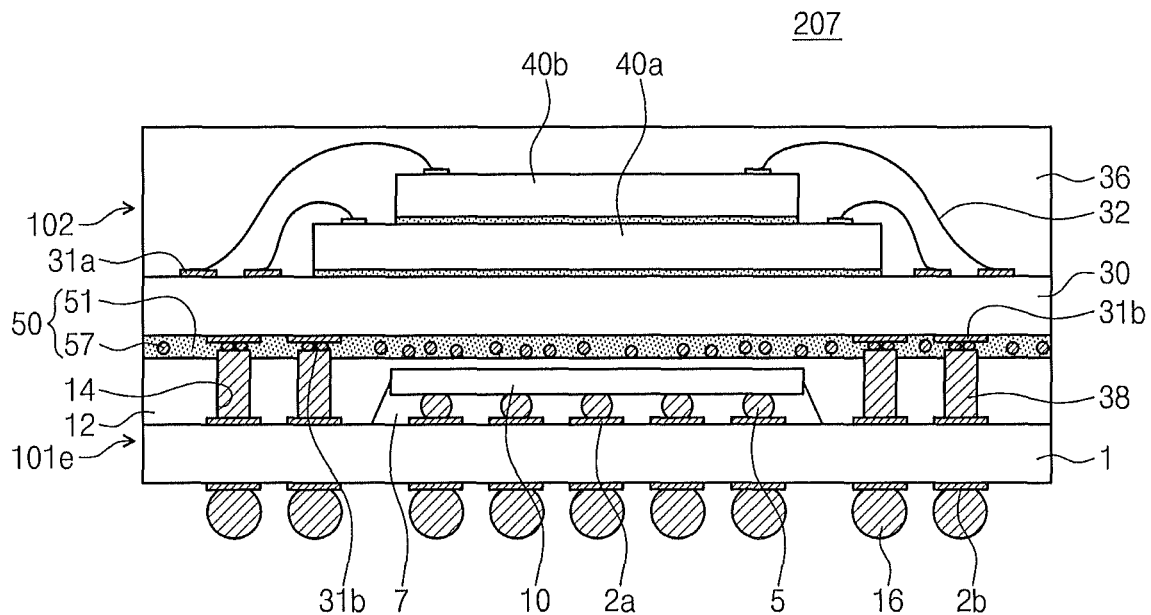
FIG. 27 is a cross-sectional view illustrating a PoP device according to an eighth embodiment of the inventive concepts.

FIG. 27 is a cross-sectional view illustrating a PoP device according to an eighth embodiment of the inventive concepts.

Referring to FIG. 27, a lower mold layer 12 covers a top surface of a lower semiconductor chip 10 in a lower semiconductor package 101e of a PoP device 207 according to the present embodiment. Additionally, an underfill resin layer 7 may be disposed between the lower semiconductor chip 10 and the lower package substrate 1. Other elements and fabricating processes of the PoP device 207 may be the same as or similar to corresponding elements and corresponding fabricating processes of the first embodiment.

Ninth Embodiment

Figure 28:
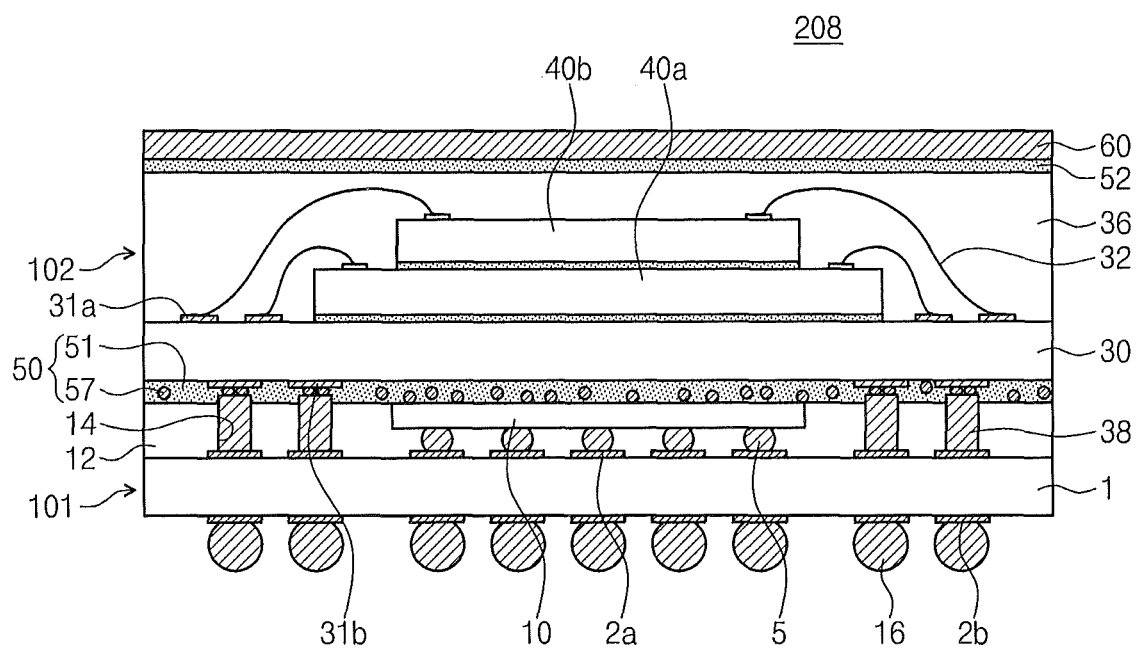
FIG. 28 is a cross-sectional view illustrating a PoP device according to a ninth embodiment of the inventive concepts.

FIG. 28 is a cross-sectional view illustrating a PoP device according to a ninth embodiment of the inventive concepts.

Referring to FIG. 28, a PoP device 208 according to the present embodiment may further include a thermal interface material layer 52 and a heat radiating plate 60 sequentially stacked on the same structure as the PoP device 200 of FIG. 1. The thermal interface material 52 may be an adhesive layer. The heat radiating plate 60 may be a metal plate or a flexible metal tape. Other elements and fabricating processes of the PoP device 208 may be the same as or similar to corresponding elements and corresponding fabricating processes of the first embodiment.

Tenth Embodiment

Figure 29:
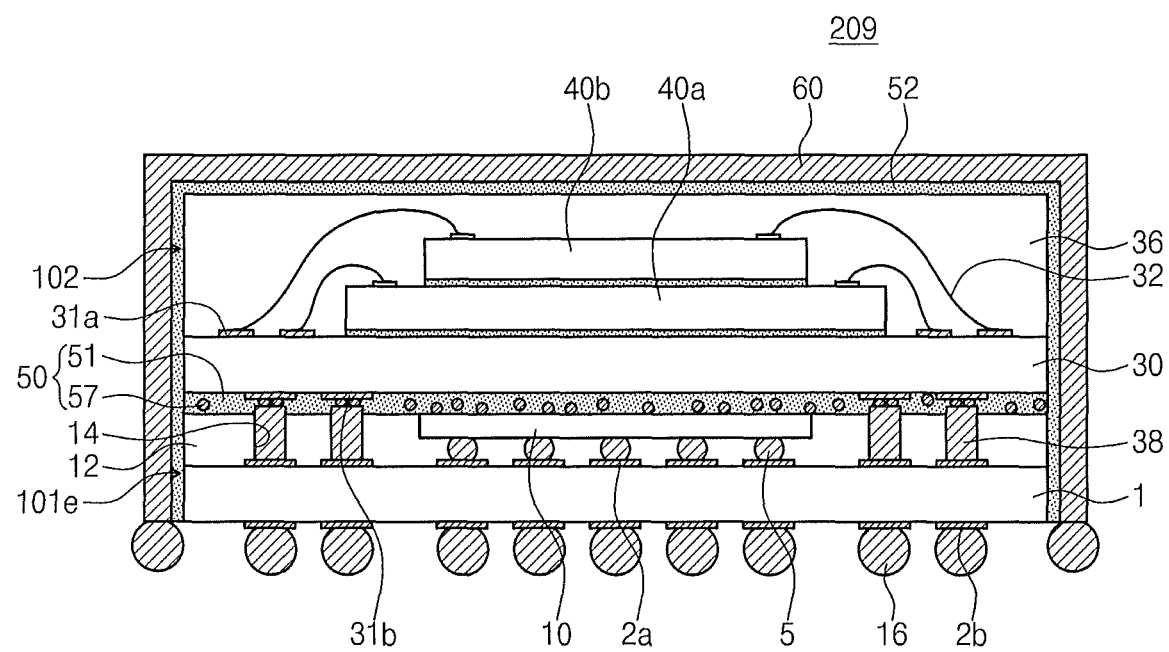
FIG. 29 is a cross-sectional view illustrating a PoP device according to a tenth embodiment of the inventive concepts.

FIG. 29 is a cross-sectional view illustrating a PoP device according to a tenth embodiment of the inventive concepts.

Referring to FIG. 29, in PoP device 209 according to the present embodiment, the thermal interface material layer 52 and the heat radiating plate 60 of the ninth embodiment may extend to cover sidewalls of the upper and lower semiconductor packages 102 and 101. Second lower solder bumps 16 may be adhered to a bottom surface of the heat radiating plate 60. In this case, a heat exhaust effect of the PoP device 209 may be increased. In the present embodiment, the heat radiating plate 60 of the PoP device 209 may have an electromagnetic interference (EMI) shielding function as well as the heat radiating function. Thus, incorrect operation of the semiconductor packages 101 and 102 may be reduced or prevented.

Eleventh Embodiment

Figure 30:
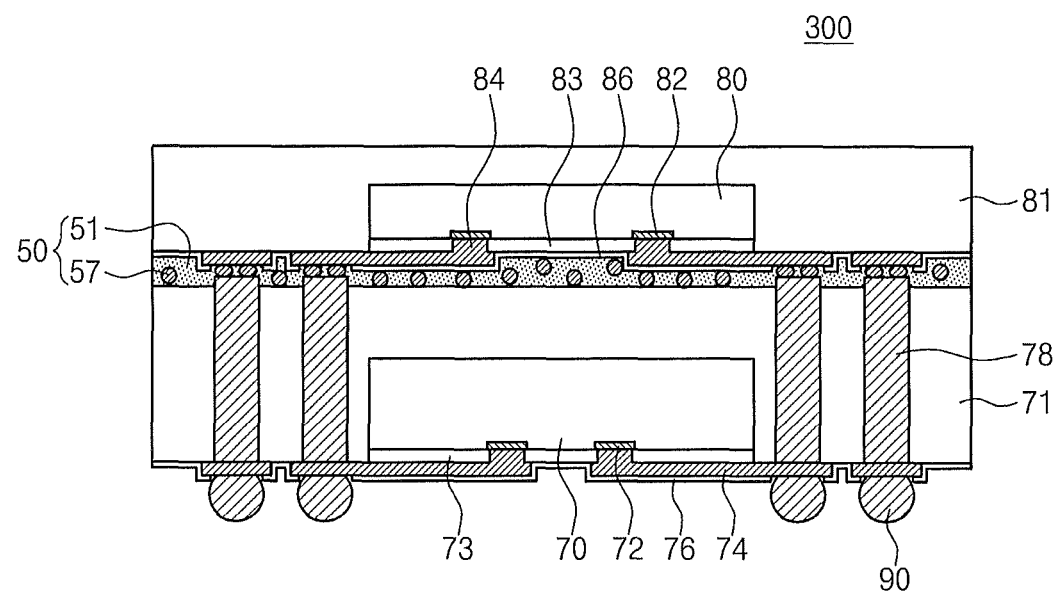
FIG. 30 is a cross-sectional view illustrating a semiconductor package according to an eleventh embodiment of the inventive concepts.

FIG. 30 is a cross-sectional view illustrating a semiconductor package according to an eleventh embodiment of the inventive concepts.

Referring to FIG. 30, a first mold layer 71 covers a sidewall and a top surface of a first semiconductor chip 70 in a semiconductor package 300 according to the present embodiment. The first semiconductor chip 70 includes first bonding pads 72 and a first passivation layer 73. The first bonding pads 72 are in contact with first redistribution patterns 74. The first redistribution patterns 74 extend onto a bottom surface of the first mold layer 71. Portions of the first redistribution patterns 74 are covered by a first protection layer 76. Connecting members 78 penetrate the first mold layer 71. The connecting members 78 are in contact with the first redistribution patterns 74. Top surfaces of the connecting members 78 may be disposed at the same level as or a higher level than a top surface of the first mold layer 71. Lower solder balls 90 are adhered to lower portions of the first redistribution patterns 74.

A second semiconductor chip 80 is disposed on the first semiconductor chip 70. A second mold layer 81 covers a sidewall and a top surface of the second semiconductor chip 80. The second semiconductor chip 80 includes second bonding pads 82 and a second passivation layer 83. The second bonding pads 82 are in contact with second redistribution patterns 84. The second redistribution patterns 84 extend onto a bottom surface of the second mold layer 81. Portions of the second distribution patterns 84 are covered by a second protection layer 86.

An anisotropic conductive film 50 is disposed between the second semiconductor chip 80 and the first mold layer 71. The second distribution patterns 84 are electrically connected to the connecting members 78 through conductive particles 57 of the anisotropic conductive film 50.

Twelfth Embodiment

Figure 31:
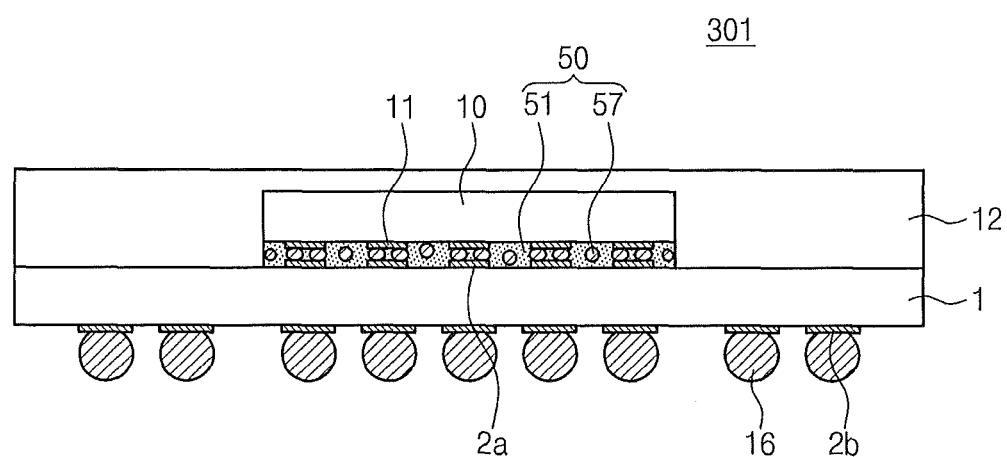
FIG. 31 is a cross-sectional view illustrating a semiconductor package according to a twelfth embodiment of the inventive concepts.

FIG. 31 is a cross-sectional view illustrating a semiconductor package according to a twelfth embodiment of the inventive concepts.

Referring to FIG. 31, a semiconductor chip 10 may be mounted on a package substrate 1 by an anisotropic conductive film 50 in a semiconductor package 301 according to the present embodiment. First conductive patterns 2a and second conductive patterns 2b are disposed on a top surface and a bottom surface of the package substrate 1, respectively. Conductive bumps 11 are disposed on a bottom surface of the semiconductor chip 10. The conductive bumps 11 are electrically connected to the first conductive patterns 2a through conductive particles 57 included in the anisotropic conductive film 50. A mold layer 12 covers a sidewall and a top surface of the semiconductor chip 10 and the package substrate 1. Lower solder balls 16 are bonded to the second conductive patterns 2b, respectively.

The semiconductor packaging techniques described above may be applied to various kinds of semiconductor devices and package modules including the various kinds of semiconductor devices.

Figure 32:
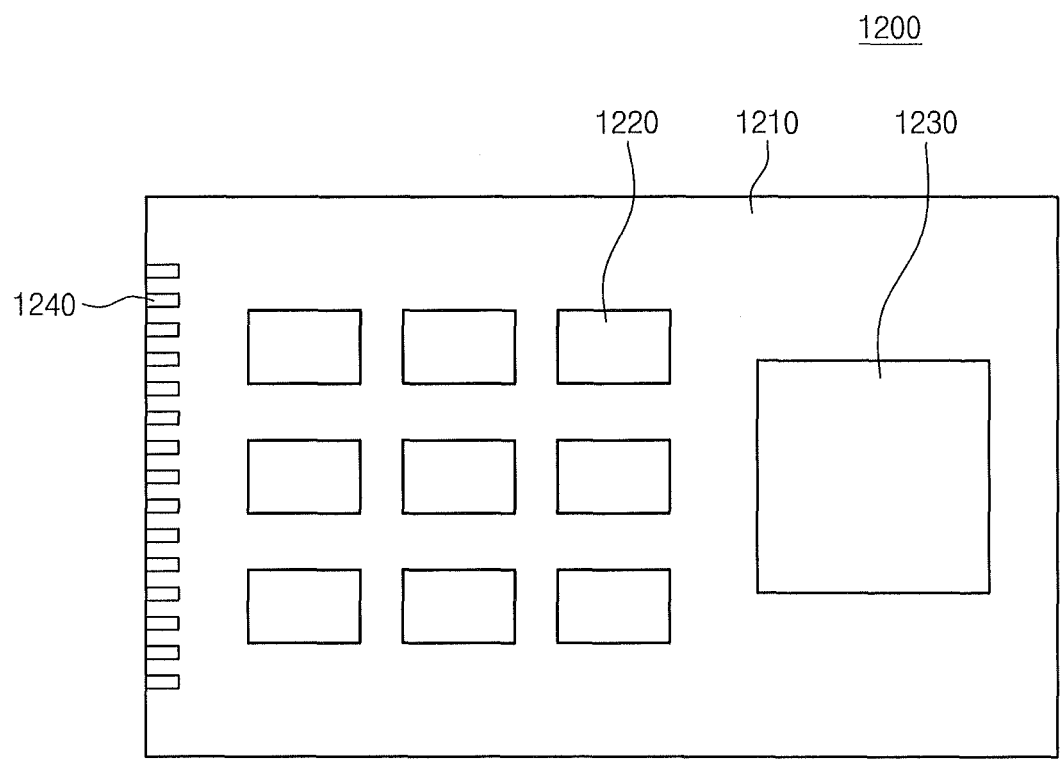
FIG. 32 is a diagram illustrating an example of a package module including a semiconductor package applied with a technical feature of the inventive concepts.

FIG. 32 is a diagram illustrating an example of a package module including a semiconductor package applied with a technical feature of the inventive concepts. Referring to FIG. 32, a package module 1200 may include a semiconductor integrated circuit chip 1220 and a semiconductor integrated circuit chip 1230 packaged using a quad flat package (QFP) technique. The devices 1220 and 1230 applied with the semiconductor packaging techniques according to the inventive concepts may be mounted on a module substrate 1210, thereby forming the package module 1200. The package module 1200 may be connected to an external electronic device through external connection terminals 1240 provided on a side of the module substrate 1210.

Figure 33:
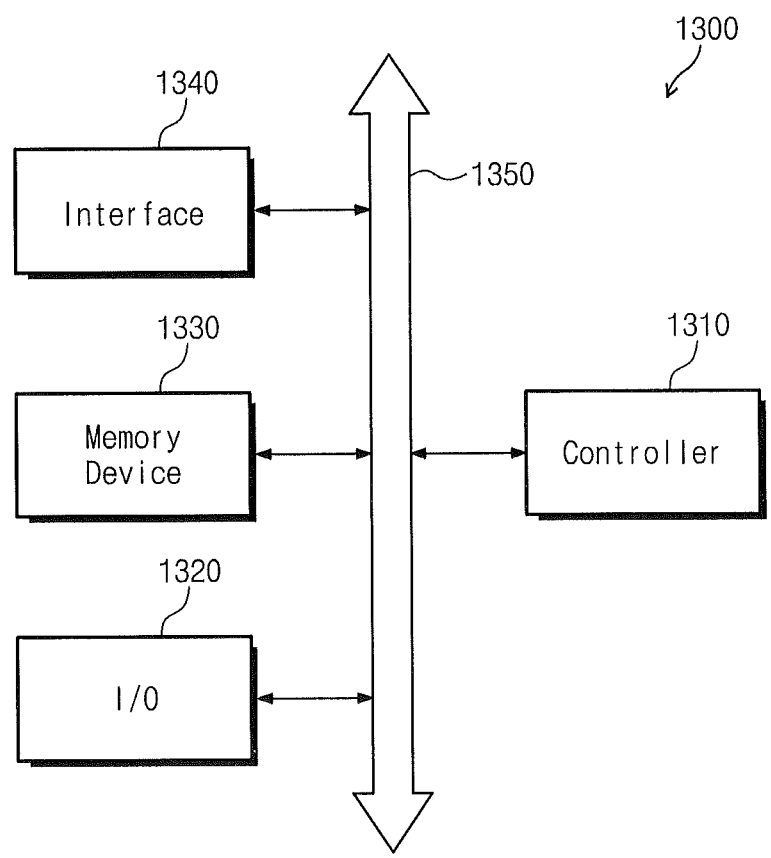
FIG. 33 is a schematic block diagram illustrating an example of an electronic system including a semiconductor package applied with a technical feature of the inventive concepts.

The semiconductor packaging techniques described above may be applied to an electronic system. FIG. 33 is a schematic block diagram illustrating an example of an electronic system including a semiconductor package applied with a technical feature of the inventive concepts. Referring to FIG. 33, an electronic system 1300 may include a controller 1310, an input/output (I/O) unit 1320, and a memory device 1330. The controller 1310, the I/O unit 1320, and the memory device 1330 may communicate with each other through a data bus 1350. The data bus 1350 may correspond to a path through which electrical signals are transmitted. For example, the controller 1310 may include at least one of a microprocessor, a digital signal processor, a microcontroller, or other logic devices having a similar function to any one thereof. The controller 1310 and the memory device 1330 may include at least one of the semiconductor packages according to the aforementioned embodiments of the inventive concept. The I/O unit 1320 may include a keypad, a keyboard and/or a display unit. The memory device 1330 stores data. The memory device 1330 may store data and/or commands executed by the controller 1310. The memory device 1330 may include a volatile memory device and/or a non-volatile memory device. In some embodiments, the memory device 1330 may include a flash memory device. For example, the flash memory device applied with the semiconductor package technique according to the inventive concept may be installed in an information processing system such as a mobile device or a desk top computer. The flash memory device may be realized as solid state disks (SSD). In this case, the electronic system 1300 may stably store data in the memory device 1330. The electronic system 1300 may further include an interface unit 1340 that transmits electrical data to a communication network and/or receives electrical data from a communication network. The interface unit 1340 may be a wireless or wired connection. For example, the interface unit 1340 may include an antenna for wireless communication or a transceiver for cable communication. Although not shown in the drawings, the electronic system 1300 may further include an application chipset and/or a camera image processor (CIS).

The electronic system 1300 may be realized as a mobile system, a personal computer, an industrial computer, or a multi-functional logic system. For example, the mobile system may be one of a personal digital assistant (PDA), a portable computer, a web tablet, a wireless phone, a mobile phone, a laptop computer, a digital music player, a memory card, or an information transmitting/receiving system. If the electronic system 1300 is an apparatus capable of performing a wireless communication, the electronic device 1300 may be used in a communication interface protocol such as a third generation communication system (e.g., CDMA, GSM, NADC, E-TDMA, WCDMA, CDMA2000).

Figure 34:
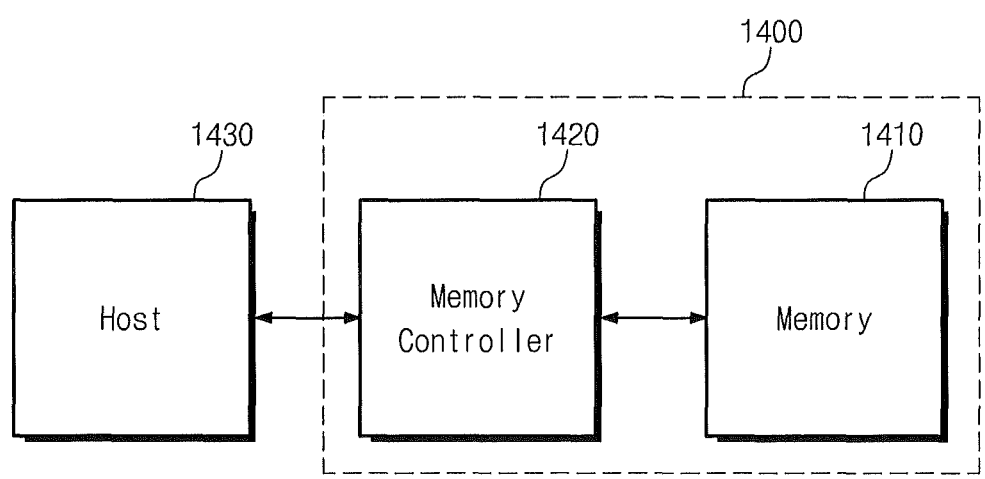
FIG. 34 is a schematic block diagram illustrating an example of a memory system including a semiconductor package applied with a technical feature of the inventive concepts.

Semiconductor devices applied with the aforementioned techniques of the inventive concepts may be provided in a memory system. FIG. 34 is a schematic block diagram illustrating an example of a memory system including semiconductor packages according to embodiments of the inventive concept. Referring to FIG. 34, a memory system 1400 may include a non-volatile memory device 1410 and a memory controller 1420. The non-volatile memory device 1410 and the memory controller 1420 may store data and/or may read stored data. The non-volatile memory device 1410 may include at least one of non-volatile memory devices applied with the semiconductor packaging techniques according to the aforementioned embodiments of the inventive concept. The memory controller 1420 may read data from/store data into the non-volatile memory device 1410 in response to read/write request of a host 1430.

The PoP device according to some embodiments of the inventive concepts includes the anisotropic conductive film disposed between the lower semiconductor package and the upper semiconductor package. Thus, an air gap between the lower and upper semiconductor packages may be removed. As a result, the heat generated from the lower semiconductor chip may be more readily transmitted toward the upper semiconductor package, thereby increasing the heat exhaust effect of the PoP device. Thus, the operating speed of the PoP device may be improved and the possibility of incorrect operation of the PoP device may be reduced.

In some embodiments, the second package substrate may include thermally conductive paths that are configured to exhaust heat that is transferred from the first semiconductor chip to the second package substrate through the anisotropic conductive film to outer edges of the second package substrate. For example, in the embodiment of FIG. 1, the lower surface of the second package substrate 30 may include metal plating in a center section thereof that extends to outer edges of the second package substrate. This metal plating may be deposited in a pattern so that the plating does not contact or substantially couple with other metal structures in the device such that the metal plating may not affect the electrical performance of the device. The metal plating, however, may serve as a thermally conductive path that transfers heat that passes from the first semiconductor chip through the anisotropic conductive film to the middle of the second package substrate (e.g., a portion of the second package substrate that is under the semiconductor chip 40a in FIG. 1 to outer regions of the second package substrate 30 (e.g., the outer perimeter of the bottom surface of the second package substrate.

The anisotropic conductive film, as discussed above, may serve as a connecting layer that electrically connects contact structures of the lower semiconductor package to respective contact structures of the upper semiconductor package. The anisotropic conductive film may be formed of an electrically insulative material and may include a plurality of conductive particles within the electrically insulative material that provide the electrical path between the respective contact structures. In some embodiments, the electrically insulative material may have thermally conductive properties.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A package-on-package (PoP) device comprising:
a lower semiconductor package and an upper semiconductor package on top of the lower semiconductor package; and
an anisotropic conductive film disposed between the lower semiconductor package and the upper semiconductor package, the anisotropic conductive film electrically connecting the lower semiconductor package to the upper semiconductor package,
wherein the lower semiconductor package comprises:
a lower package substrate;
a lower semiconductor chip on the lower package substrate;
a connecting member disposed at a side of the lower semiconductor chip and electrically connecting the lower semiconductor package to the upper semiconductor package; and
a lower mold layer on a sidewall of the connecting member and the lower semiconductor chip,
wherein a top end of the connecting member is disposed at the same level as or a higher level than a top surface of the lower mold layer,
wherein the upper semiconductor package includes an upper package substrate,
wherein the upper package substrate includes an upper conductive pattern disposed on a bottom surface of the upper package substrate and vertically overlapping with the connecting member,
wherein the anisotropic conductive film includes a resin layer and conductive particles dispersed in the resin layer, and
wherein some of the conductive particles are disposed between the upper conductive pattern and the connecting member.

2. The PoP device of claim 1, wherein the conductive particles between the upper conductive pattern and the connecting member have thicknesses less than those of the conductive particles that are spaced apart from the upper conductive pattern and the connecting member.

3. The PoP device of claim 1, wherein the conductive particles between the upper conductive pattern and the connecting member have elliptical cross sections, and
wherein the conductive particles spaced apart from the upper conductive pattern and the connecting member have substantially spherical cross-sections.

4. The PoP device of claim 1, wherein the conductive particles include at least one of a metal particle and an insulating particle coated with at least one conductive layer.

5. A package-on-package (PoP) device comprising:
a lower semiconductor package that includes a lower semiconductor chip on a lower package substrate and an upper semiconductor package that includes an upper semiconductor chip on an upper package substrate on top of the lower semiconductor package; and
an anisotropic conductive film disposed between the lower semiconductor chip and the upper package substrate, the anisotropic conductive film electrically connecting the lower package substrate to the upper package substrate,
a lower package substrate; and
a lower semiconductor chip on the lower package substrate,
wherein the upper package substrate comprises a printed circuit board,
wherein the lower semiconductor package further comprises:
a connecting member disposed at a side of the lower semiconductor chip and electrically connecting the lower package substrate to the upper package substrate; and
a lower mold layer on a sidewall of the connecting member and the lower semiconductor chip,
wherein a top end of the connecting member is disposed at a higher level than a top surface of the lower mold layer,
wherein the lower mold layer is in direct contact with a sidewall of the lower semiconductor chip and exposes a top surface of the lower semiconductor chip, and
wherein the anisotropic conductive film is in direct physical contact with the top surface of the lower semiconductor chip.

6. A package-on-package ("PoP") device, comprising:
a first package substrate having a first semiconductor chip thereon;
a second package substrate having a second semiconductor chip thereon, wherein the second package substrate is between the first semiconductor chip and the second semiconductor chip;
a connecting layer comprising an electrically insulative material having a plurality of generally spherical particles that have at least a conductive outer surface suspended therein, the connecting layer positioned between the first semiconductor chip and the second package substrate,
wherein the first package substrate and the first semiconductor chip are part of a lower semiconductor package, the lower semiconductor package further including conductive connecting members exposed at a top surface thereof, and wherein the second package substrate and the second semiconductor chip are part of an upper semiconductor package, the upper semiconductor package further including a conductive pattern exposed at a bottom surface thereof, wherein the connecting layer is interposed between the conductive connecting members and the conductive pattern.

7. The PoP device of claim 6, wherein portions of the connecting layer that are between the conductive connecting members and the conductive pattern are thinner than at least some other portions of the connecting layer that are not between the conductive connecting members and the conductive pattern.

8. The PoP device of claim 6, wherein the distance between conductive connecting members and the conductive pattern is less than a diameter of the conductive particles.

9. The PoP device of claim 6, wherein the second package substrate includes thermally conductive paths that are configured to exhaust heat that is transferred from the first semiconductor chip to the second package substrate through the connecting layer to outer edges of the second package substrate.

10. The PoP device of claim 6, wherein the connecting layer is a thermally conductive layer.

* * * * *